US012560383B2

(12) United States Patent
Kuga et al.

(10) Patent No.: US 12,560,383 B2
(45) Date of Patent: Feb. 24, 2026

(54) HEAT TREATMENT APPARATUS AND HEAT TREATMENT METHOD

(71) Applicant: Tokyo Electron Limited, Tokyo (JP)

(72) Inventors: Yasuhiro Kuga, Koshi (JP); Kazuhiko Ooshima, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 554 days.

(21) Appl. No.: 18/055,944

(22) Filed: Nov. 16, 2022

(65) Prior Publication Data

US 2023/0152038 A1 May 18, 2023

(30) Foreign Application Priority Data

Nov. 18, 2021 (JP) ................................ 2021-188088
Aug. 16, 2022 (JP) ................................ 2022-129731

(51) Int. Cl.
F27B 17/00 (2006.01)
F27D 3/00 (2006.01)
(Continued)

(52) U.S. Cl.
CPC ...... F27B 17/0083 (2013.01); F27B 17/0025 (2013.01); F27D 7/06 (2013.01);
(Continued)

(58) Field of Classification Search
CPC .............. F27B 17/0083; F27B 17/0025; F27B 17/0033; F27B 2017/0091; F27D 7/06;
(Continued)

(56) References Cited

U.S. PATENT DOCUMENTS

2016/0148823 A1* 5/2016 George ............. H01L 21/67109
219/400
2021/0118708 A1* 4/2021 Shin .................... F27B 17/0025
(Continued)

FOREIGN PATENT DOCUMENTS

JP 2001-185471 A 7/2001
JP 2013004804 A * 1/2013 ............... B05C 9/10
(Continued)

OTHER PUBLICATIONS

JP-2013004804-A translation (Year: 2013).*
KR-20060077016-A translation (Year: 2006).*
KR-20210022810-A translation (Year: 2021).*

*Primary Examiner* — Michael G Hoang
*Assistant Examiner* — Kurt Wolford
(74) *Attorney, Agent, or Firm* — Chrisman Gallo Tochtrop LLC

(57) ABSTRACT

A heat treatment apparatus includes a heating unit, a chamber, an exhaust unit, a partition unit and a switching unit. The heating unit supports and heats a substrate on which a film of a processing liquid is formed. The chamber surrounds the substrate supported by the heating unit. The exhaust unit is configured to discharge a gas from an inner space of the chamber through a discharge opening located near the heating unit. The partition unit is configured to partition the inner space of the chamber into a first space where the substrate on the heating unit is exposed and a second space located above the first space. The switching unit is configured to switch between a first state where the gas is discharged by the exhaust unit through the first space and a second state where the gas is discharged by the exhaust unit through the second space.

15 Claims, 22 Drawing Sheets

(51) Int. Cl.

| | |
|---|---|
| *F27D 7/06* | (2006.01) |
| *F27D 17/30* | (2025.01) |
| *F27D 99/00* | (2010.01) |
| *H01L 21/67* | (2006.01) |
| *H01L 21/677* | (2006.01) |

(52) U.S. Cl.
CPC ........... *F27D 17/30* (2025.01); *F27D 17/302* (2025.01); *F27D 99/007* (2013.01); *H01L 21/67103* (2013.01); *H01L 21/67109* (2013.01); *H01L 21/6719* (2013.01); *H01L 21/67748* (2013.01); *F27B 17/0033* (2013.01); *F27B 2017/0091* (2013.01); *F27D 3/0084* (2013.01); *F27D 2099/0071* (2013.01)

(58) Field of Classification Search
CPC ...... F27D 17/30; F27D 17/302; F27D 99/007; F27D 3/0084; F27D 2099/0071; H01L 21/67103; H01L 21/67109; H01L 21/6719; H01L 21/67748

See application file for complete search history.

(56) References Cited

U.S. PATENT DOCUMENTS

| | | | |
|---|---|---|---|
| 2022/0075281 A1* | 3/2022 | Do | ...................... G03F 7/70991 |
| 2023/0087029 A1* | 3/2023 | Ueno | ................ H01L 21/67288 |
| | | | 438/14 |
| 2023/0152704 A1* | 5/2023 | Kuga | ................. H01L 21/6719 |
| | | | 454/184 |

FOREIGN PATENT DOCUMENTS

| | | | |
|---|---|---|---|
| KR | 20060077016 A | * | 7/2006 |
| KR | 20210022810 A | * | 3/2021 |

* cited by examiner

HEAT TREATMENT APPARATUS AND HEAT TREATMENT METHOD

CROSS-REFERENCE TO RELATED APPLICATION

This application claims the benefit of Japanese Patent Application No. 2021-188088 filed on Nov. 18, 2021 and Japanese Patent Application No. 2022-129731 filed on Aug. 16, 2022, the entire disclosures of which are incorporated herein by reference.

TECHNICAL FIELD

The exemplary embodiments described herein pertain generally to a heat treatment apparatus and a heat treatment method.

BACKGROUND

Patent Document 1 discloses a heating apparatus configured to generate an air flow above a hot plate so as to flow from an inlet for introducing a gas toward an outlet in one direction along the surface of the hot plate.

Patent Document 1: Japanese Patent Laid-open Publication No. 2001-185471

SUMMARY

In one exemplary embodiment, a heat treatment apparatus includes a heating unit, a chamber, an exhaust unit, a partition unit and a switching unit. The heating unit is configured to support and heat a substrate on which a film of a processing liquid is formed. The chamber surrounds the substrate supported by the heating unit. The exhaust unit is configured to discharge a gas from an inner space of the chamber through a discharge opening located near the heating unit. The partition unit is configured to partition the inner space of the chamber into a first space where the substrate on the heating unit is exposed and a second space located above the first space. The switching unit is configured to switch between a first state where the gas is discharged by the exhaust unit through the first space and a second state where the gas is discharged by the exhaust unit through the second space.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numerals in different figures indicates similar or identical items.

FIG. 2 is a schematic side view illustrating a coating and developing apparatus;

Figure 3:
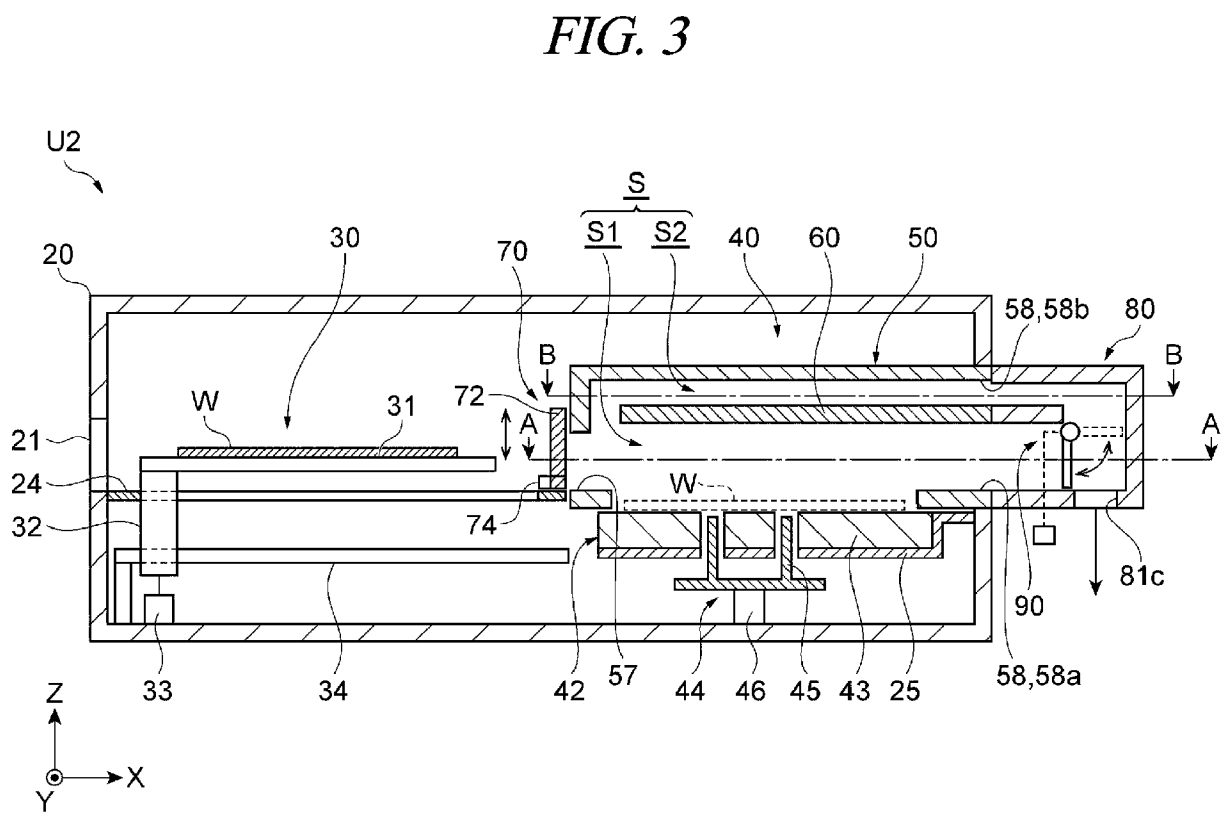

FIG. 3 is a schematic side view illustrating an example of a heat treatment unit;

FIG. 5 is a schematic bottom view illustrating an example of the chamber and the exhaust unit;

FIG. 14 is a schematic perspective view illustrating an example of a state where the chamber is being separated;

FIG. 16 is a block diagram illustrating an example of a hardware configuration of a control device;

DETAILED DESCRIPTION

Figure 1:
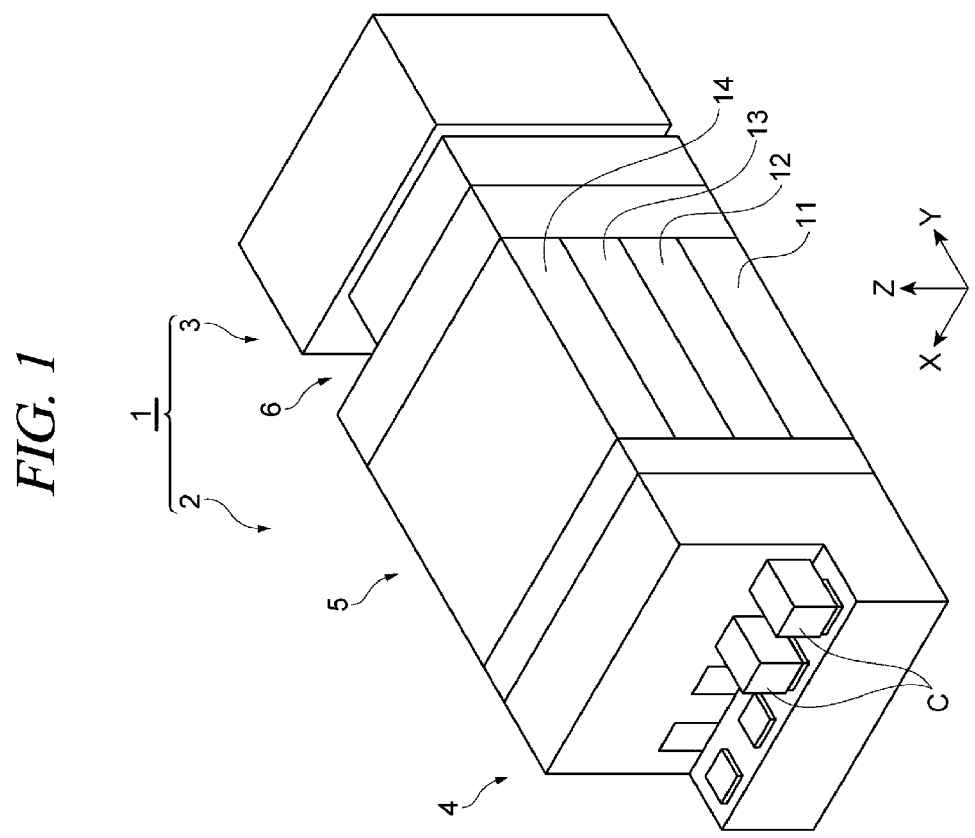
FIG. 1 is a schematic perspective view illustrating an example of a substrate processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other exemplary embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

The following exemplary embodiments are examples for describing the present disclosure, and the present disclosure is not limited thereto. In the following description, same parts or parts having same function will be assigned same reference numerals, and redundant description will be omitted.

Hereinafter, one embodiment will be described with reference to the accompanying drawings. In the description, the same components or the components having the same function are designated by like reference numerals, and duplicate description thereof will be omitted. In some drawings, there is shown an orthogonal coordinate system defined by X, Y and Z axes. In the following embodiment, the Z-axis corresponds to a vertical direction and the X-axis and the Y-axis correspond to a horizontal direction.

A substrate processing system 1 shown in FIG. 1 is configured to form a photosensitive film on a workpiece W, expose the photosensitive film and develop the photosensitive film. The workpiece W to be processed is, for example, a substrate, or a substrate on which a film, a circuit or the like is formed by being subjected to a predetermined process. The substrate is, for example, a silicon wafer. The workpiece W (substrate) may be formed into a circular shape. The workpiece W may be a glass substrate, a mask substrate, an FPD (Flat Panel Display), or the like. The photosensitive film is, for example, a resist film.

Figure 2:
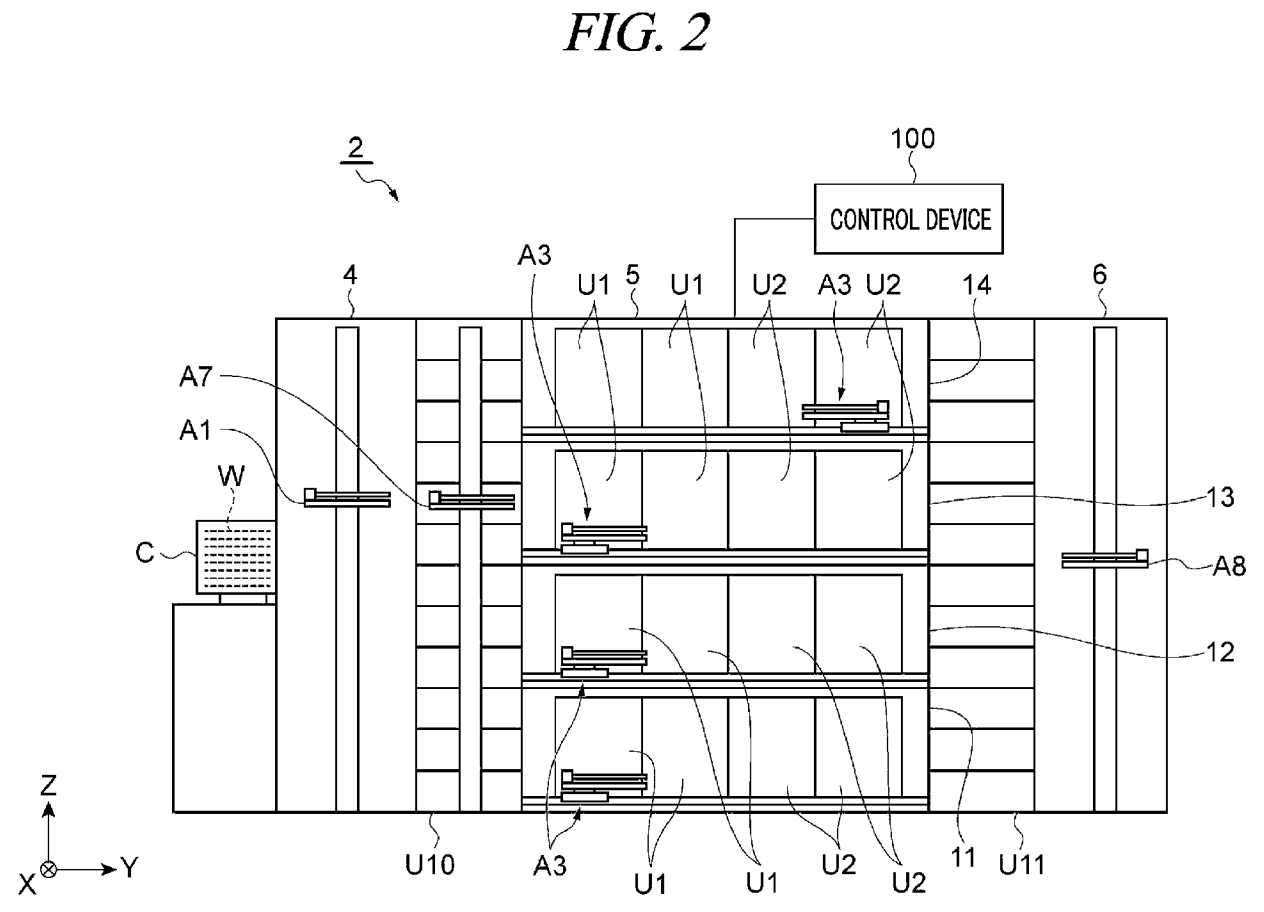

As shown in FIG. 1 and FIG. 2, the substrate processing system 1 includes a coating and developing apparatus 2 (substrate processing apparatus) and an exposure apparatus 3. The exposure apparatus 3 is configured to expose the resist film (photosensitive film) formed on the workpiece W (substrate). Specifically, the exposure apparatus 3 radiates an energy ray to an exposure target portion of the resist film by immersion exposure or the like.

[Coating and Developing Apparatus]

The coating and developing apparatus 2 is configured to form the resist film by coating a resist (chemical liquid) on a surface of the workpiece W before an exposure processing is performed by the exposure apparatus 3, and develop the resist film after the exposure processing. The coating and developing apparatus 2 (heat treatment apparatus) includes a carrier block 4, a processing block 5, an interface block 6 and a control device 100.

The carrier block 4 loads the workpiece W into the coating and developing apparatus 2 and unloads the workpiece W from the coating and developing apparatus 2. For example, the carrier block 4 can support a plurality of carriers C for the workpiece W and incorporates a transfer device A1 equipped with a transfer arm. Each of the carriers C accommodates, for example, a plurality of circular workpieces W. The transfer device A1 takes out the workpiece W from the carrier C, passes the same to the processing block 5, receives the workpiece W from the processing block 5, and returns the same to the carrier C. The processing block 5 has a plurality of processing modules 11, 12, 13 and 14.

The processing module 11 incorporates a liquid treatment unit U1, a heat treatment unit U2 and a transfer device A3 configured to transfer the workpiece W to these units. The processing module 11 forms a lower layer film on the surface of the workpiece W by the liquid treatment unit U1 and the heat treatment unit U2. The liquid treatment unit U1 coats a processing liquid for formation of the lower layer film on the workpiece W. The heat treatment unit U2 performs various heat treatments related to the formation of the lower layer film. A plurality of heat treatment units U2 may be stacked in the processing module 11.

The processing module 12 incorporates a liquid treatment unit U1, a heat treatment unit U2 and a transfer device A3 configured to transfer the workpiece W to these units. The processing module 12 forms a resist film on the lower layer film by the liquid treatment unit U1 and the heat treatment unit U2. The liquid treatment unit U1 coats a processing liquid for formation of the resist film on the lower layer film. The heat treatment unit U2 performs various heat treatments related to the formation of the resist film. A plurality of heat treatment units U2 may be stacked in the processing module 12.

The processing module 13 incorporates a liquid treatment unit U1, a heat treatment unit U2 and a transfer device A3 configured to transfer the workpiece W to these units. The processing module 13 forms an upper layer film on the resist film by the liquid treatment unit U1 and the heat treatment unit U2. The liquid treatment unit U1 coats a processing liquid for formation of the upper layer film on the resist film. The heat treatment unit U2 performs various heat treatments related to the formation of the upper layer film. A plurality of heat treatment units U2 may be stacked in the processing module 13.

The processing module 14 incorporates a liquid treatment unit U1, a heat treatment unit U2 and a transfer device A3 configured to transfer the workpiece W to these units. The processing module 14 performs development of the resist film subjected to the exposure processing and heat treatment related to the development by the liquid treatment unit U1 and the heat treatment unit U2. The liquid treatment unit U1 forms a resist pattern (develops the resist film) by coating a developer on the surface of the exposed workpiece W and then rinsing the developer with a rinsing liquid. The heat treatment unit U2 performs various heat treatments related to the development. Specific examples of the heat treatments may include heat treatment before development (PEB: Post Exposure Bake), heat treatment after development (PB: Post Bake), and the like. A plurality of heat treatment units U2 may be stacked in the processing module 14.

A shelf unit U10 is provided close to the carrier block 4 inside the processing block 5. The shelf unit U10 is partitioned into a plurality of cells arranged in a vertical direction. A transfer device A7 including an elevating arm is provided in the vicinity of the shelf unit U10. The transfer device A7 raises and lowers the workpiece W between the cells of the shelf unit U10.

A shelf unit U11 is provided close to the interface block 6 inside the processing block 5. The shelf unit U11 is partitioned into a plurality of cells arranged in the vertical direction.

The interface block 6 transfers the workpiece W to and from the exposure apparatus 3. For example, the interface block 6 incorporates a transfer device A8 including a transfer arm and is connected to the exposure apparatus 3. The transfer device A8 delivers the workpiece W disposed on the shelf unit U11 to the exposure apparatus 3. The transfer device A8 receives the workpiece W from the exposure apparatus 3 and returns the same to the shelf unit U11.

The control device 100 (controller) is configured to control various devices included in the coating and developing apparatus 2. The control device 100 controls various devices of the coating and developing apparatus 2 to perform a coating and developing processing in the following procedure. First, the control device 100 controls the transfer device A1 to transfer the workpiece W in the carrier C to the shelf unit U10, and controls the transfer device A7 to arrange the workpiece W in a cell for the processing module 11.

Subsequently, the control device 100 controls the transfer device A3 to transfer the workpiece W in the shelf unit U10 to the liquid treatment unit U1 and the heat treatment unit U2 in the processing module 11. Then, the control device 100 controls the liquid treatment unit U1 and the heat treatment unit U2 to form a lower layer film on the surface of the workpiece W. Thereafter, the control device 100 controls the transfer device A3 to return the workpiece W having the lower layer film formed thereon to the shelf unit U10, and controls the transfer device A7 to arrange the workpiece W in a cell for the processing module 12.

Subsequently, the control device 100 controls the transfer device A3 to transfer the workpiece W in the shelf unit U10 to the liquid treatment unit U1 and the heat treatment unit U2 in the processing module 12. Then, the control device 100 controls the liquid treatment unit U1 and the heat treatment unit U2 to form a resist film on the lower layer film of the workpiece W. Thereafter, the control device 100 controls the transfer device A3 to return the workpiece W to the shelf unit U10, and controls the transfer device A7 to arrange the workpiece W in a cell for the processing module 13.

Subsequently, the control device 100 controls the transfer device A3 to transfer the workpiece W in the shelf unit U10 to each unit in the processing module 13. Then, the control device 100 controls the liquid treatment unit U1 and the heat treatment unit U2 to form an upper layer film on the resist film of the workpiece W. Thereafter, the control device 100 controls the transfer device A3 to transfer the workpiece W to the shelf unit U11.

Subsequently, the control device 100 controls the transfer device A8 to transfer the workpiece W in the shelf unit U11 to the exposure apparatus 3. Then, the control device 100 controls the transfer device A8 to receive the workpiece W, which has been subjected to the exposure processing, from the exposure apparatus 3 and to arrange the workpiece W in a cell for the processing module 14 in the shelf unit U11.

Subsequently, the control device 100 controls the transfer device A3 to transfer the workpiece W in the shelf unit U11 to each unit in the processing module 14, and controls the liquid treatment unit U1 and the heat treatment unit U2 to perform development of the resist film on the workpiece W. Then, the control device 100 controls the transfer device A3 to return the workpiece W to the shelf unit U10, and controls the transfer device A7 and the transfer device A1 to return the same into the carrier C.

In the manner as described above, the coating and developing processing for one workpiece W is completed. The control device 100 controls various devices of the coating and developing apparatus 2 to perform the coating and developing processing for each of a subsequent plurality of workpieces W in the same manner as described above. The specific configuration of the coating and developing apparatus 2 is not limited to the example described above. The coating and developing apparatus 2 may have any configuration as long as it includes a unit that performs a heat treatment.

[Heat Treatment Unit]

Hereinafter, an example of the heat treatment unit U2 will be described in detail with reference to FIG. 3 to FIG. 15B. The heat treatment unit U2 (heat treatment apparatus) is configured to perform at least a heating treatment on the workpiece W. As shown in FIG. 3, the heat treatment unit U2 includes, for example, a housing 20, a transfer unit 30 and a heating treatment unit 40.

(Housing)

The housing 20 accommodates a part of a member included in the heat treatment unit U2. The housing 20 may extend along a horizontal direction (for example, X-axis direction in the drawings). An inner space of the housing 20 may have a rectangular parallelepiped shape. A carry-in opening 21 through which the workpiece W is carried into the housing 20 is formed in a side wall on one side of the housing 20 in a longitudinal direction. In the following description, the longitudinal direction of the housing 20 is a front-back direction, and a horizontal direction (for example, Y-axis direction in the drawings) orthogonal to the longitudinal direction of the housing 20 is a left-right direction. The carry-in opening 21, the transfer unit 30 and the heating treatment unit 40 are arranged in this order in the front-back direction.

(Transfer Unit)

The transfer unit 30 transfers the workpiece W, and performs cooling of the workpiece W. The transfer unit 30 includes, for example, a cooling plate 31, a connection portion 32, a driver 33 and a guide rail 34. The cooling plate 31 supports and cools the workpiece W. A coolant path (not shown) through which a coolant for cooling flows is formed in the cooling plate 31. The connection portion 32 is connected to the cooling plate 31. The connection portion 32 is movable along the front-back direction in the housing 20. A base 24 that partitions the inner space of the housing 20 into an upper portion and a lower portion may be provided in the housing 20. The cooling plate 31 is located above the base 24, and the connection portion 32 penetrates through the base 24 in the vertical direction.

The driver 33 includes a driving source such as an electric motor, and moves the connection portion 32 along the guide rail 34 extending in the front-back direction. As the connection portion 32 moves, the cooling plate 31 moves along the front-back direction. The driver 33 drives the connection portion 32 in order for the cooling plate 31 to reciprocate between a heating position where the workpiece W is heated in the heating treatment unit 40 and a standby position which is between the heating position and the carry-in opening 21. The transfer unit 30 (cooling plate 31) performs cooling of the workpiece W at the standby position.

(Heating Treatment Unit)

The heating treatment unit 40 performs heating of the workpiece W at the heating position. The heating treatment unit 40 includes a heating unit 42, an elevating unit 44, a chamber 50, a partition unit 60, a shutter unit 70, an exhaust unit 80 and a switching unit 90. First, the heating treatment unit 40 will be described briefly. The heating unit 42 supports and heats the workpiece Won which a film of a processing liquid has been formed. The elevating unit 44 delivers the workpiece W to and from the cooling plate 31 of the transfer unit 30.

The chamber 50 is provided to surround the workpiece W supported by the heating unit 42. The chamber 50 is a housing, and forms a space (hereinafter, referred to as "inner space S") in which the workpiece W is heated. The partition unit 60 partitions the inner space S of the chamber 50 into a processing space S1 (first space) where the workpiece W on the heating unit 42 is exposed and a retreat space S2 (second space) located above the processing space S1. The shutter unit 70 is a member configured to open and close a carry-in/out opening 57 for the workpiece W provided in a side wall of the chamber 50. When the shutter unit 70 closes the carry-in/out opening 57, the inner space S is formed. While the inner space S is formed, heating of the workpiece W is performed.

The exhaust unit 80 discharges a gas from the inner space S of the chamber 50 through a discharge opening 58 located in the vicinity of the heating unit 42. While the workpiece W is heated, sublimates are generated from the film of the processing liquid formed on the surface of the workpiece W. As the gas is discharged (exhausted) by the exhaust unit 80, the sublimates generated in the inner space S are collected. The discharge opening 58 includes a first discharge opening 58a that is opened to the processing space S1 and a second discharge opening 58b that is opened to the retreat space S2.

The switching unit 90 switches between a state where a gas is discharged by the exhaust unit 80 through the processing space S1 (hereinafter, referred to as "first exhaust state") and a state where a gas is discharged by the exhaust unit 80 through the retreat space S2 (hereinafter, referred to as "second exhaust state"). In the first exhaust state (first state), the exhaust unit 80 discharges a gas from the processing space S1 through the first discharge opening 58a, but does not discharge a gas from the retreat space S2 through the second discharge opening 58b. In the second exhaust state (second state), the exhaust unit 80 discharges a gas from the retreat space S2 through the second discharge opening 58b, but does not discharge a gas from the processing space S1 through the first discharge opening 58a.

The standby position where the cooling plate 31 performs cooling of the workpiece W, the shutter unit 70, the chamber 50 (the heating unit 42) and the exhaust unit 80 are arranged in this order in the front-back direction. Most of the exhaust unit 80 may be provided so as to protrude from the housing 20 to the outside. Hereinafter, an example of each member included in the heating treatment unit 40 will be described in detail.

<Heating Unit>

The heating unit 42 is fixed at a predetermined position in the housing 20. The heating unit 42 is supported by, for example, a base 25. The base 25 is fixed at a bottom wall or a side wall of the housing 20. The base 25 may be connected to the base 24. The heating unit 42 has a hot plate 43 formed into a circular plate shape. A heater is provided in the hot plate 43. The hot plate 43 may have a greater diameter than the workpiece W. The workpiece W is supported on an upper surface of the hot plate 43, and as the temperature of the hot plate 43 increases, the workpiece W is heated.

<Elevating Unit>

The elevating unit 44 raises and lowers the workpiece W above the hot plate 43. The elevating unit 44 raises and lowers the workpiece W, for example, between a processing height at which the workpiece W is supported (placed) on the heating unit 42 and a delivery height at which the workpiece W is delivered to and from the transfer unit 30 in an upper portion separated from the heating unit 42. The elevating unit 44 includes a plurality of elevating pins 45 and an elevation driver 46. The elevating pins 45 support a lower surface of the workpiece W, and penetrate through the heating unit 42 in the vertical direction. The elevation driver 46 includes a driving source such as an electric motor or a cylinder, and moves the elevating pins 45 in the vertical direction.

<Chamber>

Figure 4:
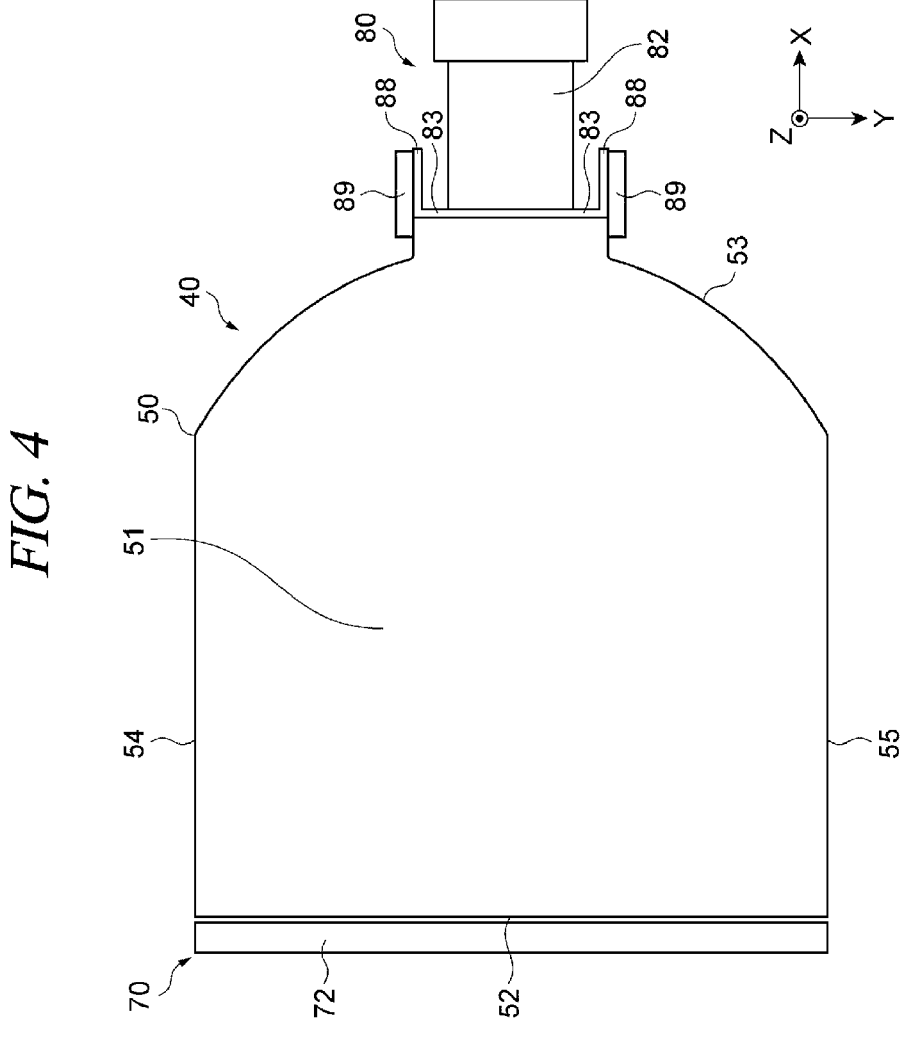
FIG. 4 is a schematic top view illustrating an example of a chamber and an exhaust unit.
Figure 5:
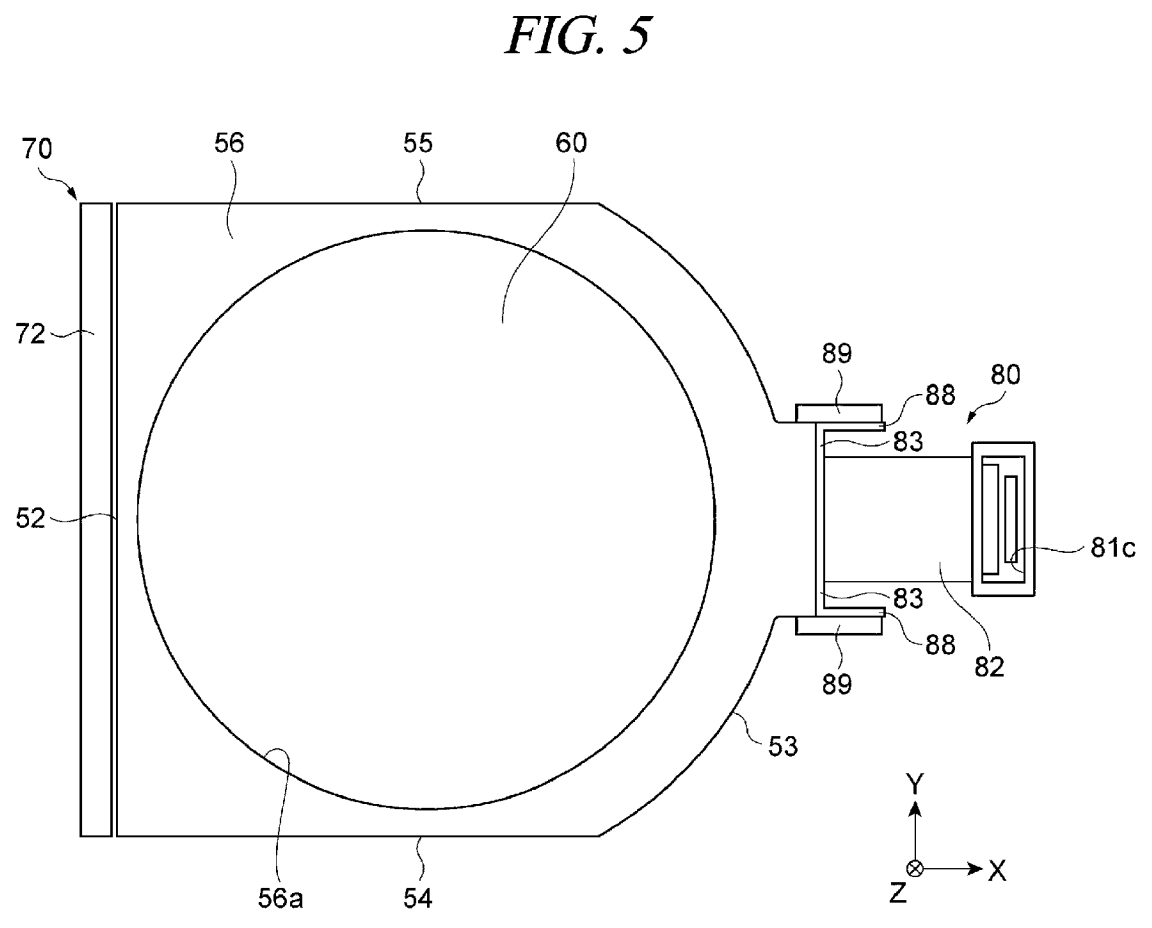

The chamber 50 covers the workpiece W supported by the heating unit 42 and thus forms the inner space S together with the shutter unit 70. The inner space S is a space that is closed enough to sufficiently heat the film of the processing liquid formed on the workpiece W. The chamber 50 extends in the front-back direction when viewed from the top as shown in FIG. 4 or FIG. 5. An outer periphery of the chamber 50 may have a rectangular shape with one side open near the standby position and a circular arc shape far from the standby position. The outer periphery of the chamber 50 has a rectangular shape with a circular arc-shaped side, and the circular arc-shaped side protrudes toward the outside.

The chamber 50 has a top plate 51, a bottom wall 56, a side wall 52, a side wall 53, a side wall 54 and a side wall 55. The top plate 51 is a plate-shaped member covering the heating unit 42 and the bottom wall 56. When viewed from the top, an outer periphery of the top plate 51 surrounds an outer periphery of the heating unit 42 (the hot plate 43), and the top plate 51 has a greater area than the heating unit 42. The outer periphery of the top plate 51 forms the outer periphery of the chamber 50. An upper surface of the inner space S is defined by the top plate 51.

The bottom wall 56 surrounds the workpiece W supported by the heating unit 42. When viewed from the top, an outer periphery of the bottom wall 56 surrounds the outer periphery of the heating unit 42 (the hot plate 43), and the area surrounded by the outer periphery of the bottom wall 56 is greater than the area of the heating unit 42. As shown in FIG. 5, the bottom wall 56 includes an exposure hole 56a for exposing the heating unit 42 (see FIG. 7). The exposure hole 56a may be smaller than the outer periphery of the heating unit 42. The bottom wall 56 is provided near the workpiece W supported by the heating unit 42. At least a part of the bottom wall 56 may surround at least one of the side of the heating unit 42 (the hot plate 43) and the side of the workpiece W on the heating unit 42. When viewed from the top, a part of the bottom wall 56 may cover a peripheral portion of the heating unit 42 (see FIG. 11). A lower portion of the bottom wall 56 may be located at the same height position in the vertical direction as an upper portion of the heating unit 42. The bottom wall 56 is provided at a gap with the heating unit 42. In the example shown in FIG. 11, a part of the bottom wall 56 covers a peripheral portion of the heating unit 42 from the top (overlaps the peripheral portion of the heating unit 42 when viewed from the top), and there is a gap between a portion of the bottom wall 56 covering the peripheral portion of the heating unit 42 and the heating unit 42. One end of the gap between the heating unit 42 and the bottom wall 56 may be opened to the processing space S1 so as to be directed toward the center of the heating unit 42. In the present disclosure, a positional relationship between the bottom wall 56 and the heating unit 42 corresponds to a positional relationship between the bottom wall 56 and the hot plate 43. Also, if the chamber 50 can be attached and detached as described below, the above-described positional relationships between the bottom wall 56 and the heating unit 42 are based on a state where the chamber 50 is mounted. A lower surface of the inner space S is defined by the bottom wall 56 and the heating unit 42.

The side wall 52, the side wall 53, the side wall 54 and the side wall 55 are provided between the top plate 51 and the bottom wall 56. Each of the side wall 52, the side wall 53, the side wall 54 and the side wall 55 extends downwards from a peripheral portion of the top plate 51. A part of a side surface of the inner space S is defined by the side wall 52, the side wall 53, the side wall 54 and the side wall 55. The side wall 52 and the side wall 53 are arranged with the heating unit 42 interposed therebetween in the front-back direction. The side wall 54 and the side wall 55 are arranged with the heating unit 42 interposed therebetween in the left-right direction. The side wall 52 is located closer to the shutter unit 70 (or the above-described standby position) than the side wall 53. In this case, the shutter unit 70, the side wall 52 and the side wall 53 are arranged in this order in the front-back direction.

The side wall 52 extends along the left-right direction. One end of the side wall 52 in the left-right direction is connected to the side wall 54, and the other end of the side wall 52 in the left-right direction is connected to the side wall 55. Each of the side wall 54 and the side wall 55 extends along the front-back direction. In the front-back direction, the length of the side wall 54 may be approximately identical to the length of the side wall 55.

One end of the side wall 53 is connected to the side wall 54, and the other end thereof is connected to the side wall 55. When viewed from the top, the side wall 53 has a circular arc shape. In the left-right direction, the length of the side wall 53 may be approximately identical to the length of the side wall 52. When viewed from the top, the side wall 53 may extend along a circumferential direction around the center of the heating unit 42 (or the center of the hot plate 43). A central portion of the side wall 53 in the left-right direction may have a greater thickness in the front-back direction than the other portion. The central portion of the side wall 53 in the left-right direction may protrude in a direction away from the shutter unit 70. A protrusion of the central portion of the side wall 53 in the left-right direction may be surrounded by a side wall of the housing 20 opposite to the side wall where the carry-in opening 21 is provided.

Figures 6A, 6B:
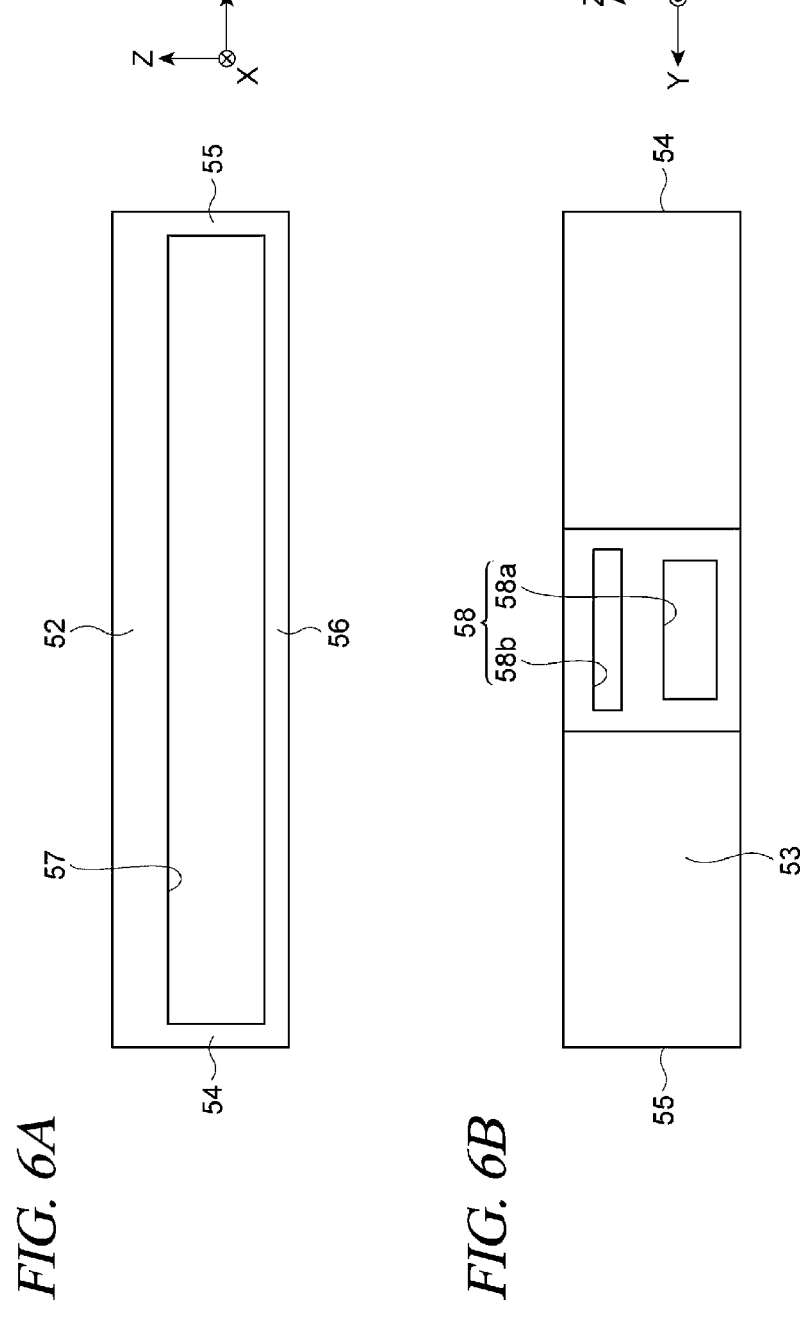
FIG. 6A and FIG. 6B are schematic side views illustrating an example of the chamber.

As shown in FIG. 6A, the carry-in/out opening 57 for the workpiece W is formed in the side wall 52. The carry-in/out opening 57 is an opening through which the workpiece W is carried in and carried out. The workpiece W is carried into the chamber 50 through the carry-in/out opening 57, and the workpiece W is carried out of the chamber 50 through the carry-in/out opening 57. The carry-in/out opening 57 is formed to allow the cooling plate 31 that supports the workpiece W to pass therethrough. The carry-in/out opening 57 extends along the left-right direction, and the width of the carry-in/out opening 57 is greater than the diameter of the workpiece W. In the vertical direction, the length of the carry-in/out opening 57 may be about half the length of the chamber 50.

As shown in FIG. 6B, the discharge opening 58 including the first discharge opening 58a and the second discharge opening 58b is formed in the side wall 53. The discharge opening 58 is an opening through which a gas is discharged from the inner space S of the chamber 50. The first discharge opening 58a and the second discharge opening 58b (the discharge opening 58) are formed in the central portion of the side wall 53 in the left-right direction. In the left-right direction, the lengths of the first discharge opening 58a and the second discharge opening 58b are smaller than the length of the carry-in/out opening 57. The first discharge opening 58a and the second discharge opening 58b are arranged in the vertical direction, and the second discharge opening 58b is located above the first discharge opening 58a. The carry-in/out opening 57 and the discharge opening 58 (the first discharge opening 58a and the second discharge opening 58b) are arranged with the heating unit 42 interposed therebetween in the front-back direction.

<Partition Unit Flow Path Control Unit>

Figure 7:
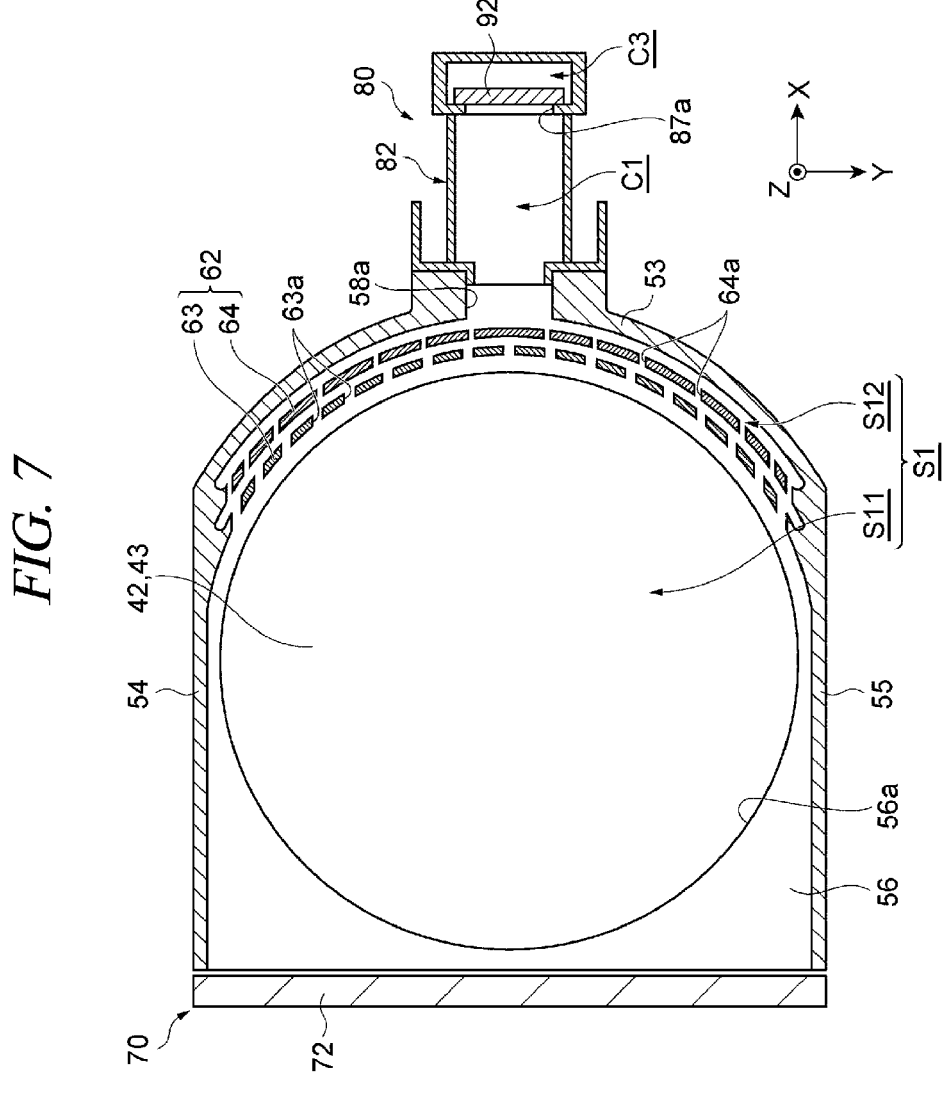
FIG. 7 is a schematic top view illustrating an example of an inside of the chamber.

As shown in FIG. 3, the inner space S of the chamber 50 is partitioned into the processing space S1 and the retreat space S2 by the partition unit 60. The processing space S1 is a space where the workpiece W supported by the heating unit 42 is exposed, and the retreat space S2 is a space located above the processing space S1. The partition unit 60 is formed into, for example, a plate shape, and may cover the entire area of the heating unit 42 and a part of the bottom wall 56. A heater may be provided in the partition unit 60. As the partition unit 60 is heated by the heater, the temperatures of the partition unit 60 and a member connected to partition unit 60 increase, which suppresses adhesion of sublimates to these members. FIG. 7 is a cross-sectional view taken along a line A-A of FIG. 3, and the line A-A passes through the processing space S1.

The processing space S1 is partitioned by the side wall 53, the side wall 54, the side wall 55, the bottom wall 56, the heating unit 42, the shutter unit 70 and a lower surface of the partition unit 60. The first discharge opening 58a is formed in a portion of the side wall 53 that partitions the processing space S1. When viewed from the top (when the heating unit 42 is viewed from the top), a direction connecting the center of the heating unit 42 and the center of the first discharge opening 58a corresponds to the front-back direction. When viewed from the top, a direction orthogonal to the direction connecting the center of the heating unit 42 (the center of the hot plate 43) and the center of the first discharge opening 58a corresponds to the left-right direction (width direction). The first discharge opening 58a is an opening through which a gas is discharged from the processing space S1. The first discharge opening 58a is opened to the processing space S1. When a gas is discharged from the processing space S1, the gas flows toward the first discharge opening 58a in the processing space S1. In the left-right direction, the first discharge opening 58a has a smaller length than the heating unit 42.

The heating treatment unit 40 may be provided with a flow path control unit 62. The flow path control unit 62 forms a flow path for a gas that flows toward the first discharge opening 58a between the heating unit 42 and the side wall 53. Since the flow path control unit 62 is provided, it becomes easy for a gas in the processing space S1 to flow toward the first discharge opening 58a. The flow path control unit 62 is provided between the heating unit 42 and the side wall 53 when viewed from the top. The flow path control unit 62 has, for example, an inner wall 63 and an inner wall 64.

Figure 8:
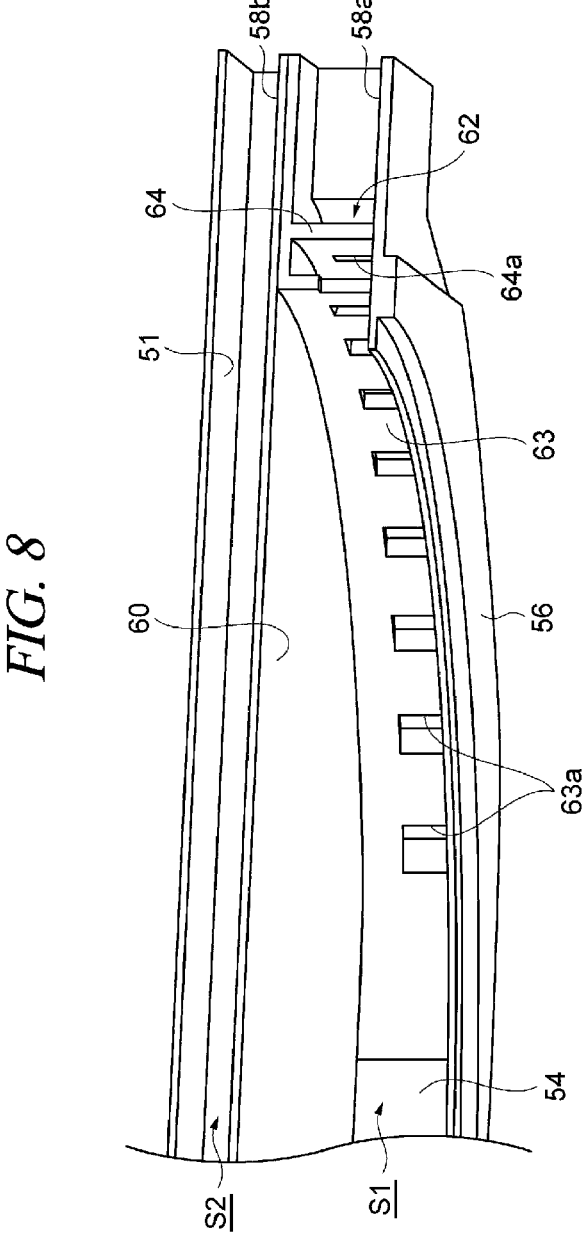
FIG. 8 is a schematic perspective view illustrating an example of a flow path control unit.

The inner wall 63 is provided around the heating unit 42 in the processing space S1. The inner wall 63 is provided to partition the processing space S1 into an accommodation space S11 including the heating unit 42 and a control space S12 including the first discharge opening 58a. The inner wall 63 extends between the bottom wall 56 and the partition unit 60 in the vertical direction as shown in FIG. 8. An upper end of the inner wall 63 is connected to the lower surface of the partition unit 60, and a lower end of the inner wall 63 is connected to an upper surface of the bottom wall 56. One end of the inner wall 63 in the left-right direction is connected to the side wall 54, and the other end of the inner wall 63 in the left-right direction is connected to the side wall 55. When viewed from the top, the inner wall 63 may have a circular arc shape that extends along the circumferential direction around the center of the heating unit 42. In the left-right direction, the length of the inner wall 63 may be greater than the length of the workpiece W on the heating unit 42.

The inner wall 63 includes a plurality of discharge holes 63a arranged in an extension direction of the inner wall 63. Each of the plurality of discharge holes 63a is an opening that connects the accommodation space S11 and the control space S12. A gas in the accommodation space S11 is introduced into the control space S12 through the plurality of discharge holes 63a. Each of the plurality of discharge holes 63a penetrates through the inner wall 63 along the front-back direction. This means that an inner wall forming the penetrating holes (openings) penetrates through the inner wall 63 so as to extend along the front-back direction.

The plurality of discharge holes 63a formed in the inner wall 63 is scattered in the left-right direction. In the left-right direction, the distance between end portions of a region where the plurality of discharge holes 63a is formed in the inner wall 63 may be greater than 90% of the diameter of the workpiece W or may be greater than the diameter of the workpiece W. The distance between the end portions of the region where the discharge holes 63 are formed is defined as the shortest distance between a right end portion of the discharge hole 63*a* at the rightmost end and a left end portion of the discharge hole 63*a* at the leftmost end in the left-right direction.

The inner wall 64 (second inner wall) is located between the inner wall 63 and the side wall 53. The inner wall 64 is provided to partition the control space S12 into a buffer space including the inner wall 63 and a discharge space including the first discharge opening 58*a*. The inner wall 64 extends between the bottom wall 56 and the partition unit 60 in the vertical direction as shown in FIG. 8. An upper end of the inner wall 64 is connected to the lower surface of the partition unit 60, and a lower end of the inner wall 64 is connected to the upper surface of the bottom wall 56. One end of the inner wall 64 in the left-right direction is connected to the side wall 54, and the other end of the inner wall 64 in the left-right direction is connected to the side wall 55. The inner wall 64 may have a circular arc shape that extends along the circumferential direction around the center of the heating unit 42 (the hot plate 43). In the left-right direction, the length of the inner wall 64 may be approximately identical to the length of the inner wall 63.

The inner wall 64 includes a plurality of discharge holes 64*a* (a plurality of second discharge holes) arranged in an extension direction of the inner wall 64. Each of the plurality of discharge holes 64*a* is an opening that connects the buffer space and the discharge space. A gas in the accommodation space S11 is introduced into the buffer space through the plurality of discharge holes 63*a* formed in the inner wall 63 and then introduced into the discharge space through the plurality of discharge holes 64*a* formed in the inner wall 64. Each of the plurality of discharge holes 64*a* penetrates through the inner wall 64 along the front-back direction.

The plurality of discharge holes 64*a* formed in the inner wall 64 is scattered in the left-right direction. The plurality of discharge holes 64*a* is formed to disperse a flow rate of a gas flowing through the plurality of discharge holes 63*a* formed in the inner wall 63 (to reduce deviation in the left-right direction) by exhaust through the first discharge opening 58*a*. The first discharge opening 58*a* is located at a central portion in the left-right direction of the processing space S1. Therefore, assuming that the plurality of discharge holes 63*a* is formed at an approximately equal distance from each other in the inner wall 63 without the inner wall 64 (the plurality of discharge holes 64*a*), a gas flow rate becomes higher in some discharge holes 63*a* located at the central portion in the left-right direction than in the other discharge holes 63*a*. In this case, the flow of gas becomes stronger above a central portion in the left-right direction of the workpiece Won the heating unit 42 than in the other portion.

The arrangement of the plurality of discharge holes 63*a* in the inner wall 63 is different from the arrangement of the plurality of discharge holes 64*a* in the inner wall 64. For example, the number of the plurality of discharge holes 63*a* is different from the number of the plurality of discharge holes 64*a*, and the distance between adjacent discharge holes is changed in different ways from each other. At least some of the plurality of discharge holes 64*a* do not overlap the plurality of discharge holes 63*a* when viewed from the front-back direction.

Figure 9:
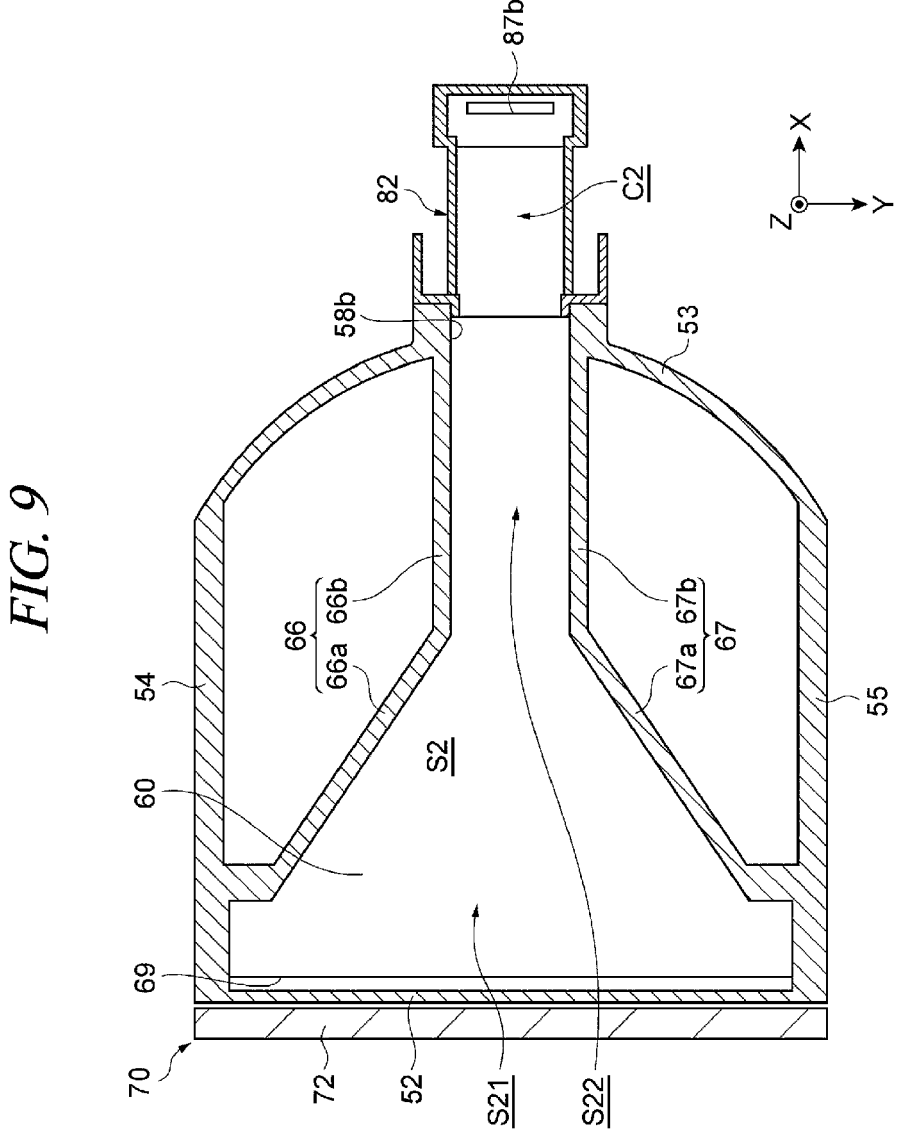
FIG. 9 is a schematic top view illustrating an example of the inside of the chamber.

FIG. 9 is a cross-sectional view taken along a line B-B of FIG. 3, and the line B-B passes through the retreat space S2. The partition unit 60 is fixed at the side wall 54, the side wall 55 and the side wall 53. The partition unit 60 may be integrally formed with the chamber 50. The retreat space S2 is partitioned by an upper surface of the partition unit 60, the side wall 52, the side wall 53, the side wall 54, the side wall 55 and a lower surface of the top plate 51.

The second discharge opening 58*b* is formed in a portion of the side wall 53 that partitions the retreat space S2. When viewed from the top, the center of the second discharge opening 58*b* (central portion in the left-right direction) may be approximately matched with the center of the first discharge opening 58*a* (central portion in the left-right direction). The second discharge opening 58*b* is an opening through which a gas is discharged from the retreat space S2. The second discharge opening 58*b* is opened to the retreat space S2. When a gas is discharged from the retreat space S2, the gas flows toward the second discharge opening 58*b* in the retreat space S2. In the left-right direction, the second discharge opening 58*b* has a smaller length than the heating unit 42.

The retreat space S2 and the processing space S1 are connected to each other via a connection port 69. The connection port 69 is formed between the partition unit 60 and the side wall 52. The connection port 69 is located between the side wall 52 and the heating unit 42 (the workpiece W on the heating unit 42) in the front-back direction. The connection port 69 is opened extending along the side wall 52. The length of the connection port 69 in the left-right direction may be greater than the diameter of the workpiece Won the heating unit 42. In the left-right direction, the connection port 69 has a greater length than the second discharge opening 58*b*. The retreat space S2 may include a flow path S21 (first flow path) including the connection port 69 and a flow path S22 (second flow path) having a smaller width in the left-right direction than the flow path S21.

The heating treatment unit 40 may include a flow path forming member 66 and a flow path forming member 67. The flow path forming member 66 and the flow path forming member 67 are configured to partition the retreat space S2 into a region where a gas flows toward the second discharge opening 58*b* and a region where the gas does not flow. When viewed from the top, the flow path forming member 66 and the flow path forming member 67 are axisymmetric with respect to a virtual line passing through a central portion of the chamber 50 in the left-right direction and extending in the front-back direction. The flow path forming member 66 and the flow path forming member 67 are inner walls extending between the upper surface of the partition unit 60 and the lower surface of the top plate 51. An upper end of the flow path forming member 66 and an upper end of the flow path forming member 67 are connected to the lower surface of the top plate 51, and a lower end of the flow path forming member 66 and a lower end of the flow path forming member 67 are connected to the upper surface of the partition unit 60. The flow path forming member 66 includes an inner wall 66*a* and an inner wall 66*b*, and the flow path forming member 67 includes an inner wall 67*a* and an inner wall 67*b*.

One end of the inner wall 66*a* is connected to a portion of the side wall 54 close to the connection port 69, and the inner wall 66*a* extends with inclination to both the left-right direction and the front-back direction. The position of the other end of the inner wall 66*a* in the left-right direction is approximately matched with the position of an end portion of the second discharge opening 58*b* close to the side wall 54. The other end of the inner wall 66*a* is connected to one end of the inner wall 66*b*. The inner wall 66*b* extends to the side wall 53 along the front-back direction.

One end of the inner wall 67*a* is connected to a portion of the side wall 55 close to the connection port 69, and the inner wall 67*a* extends with inclination to both the left-right direction and the front-back direction. The position of the other end of the inner wall 67*a* in the left-right direction is approximately matched with the position of an end portion of the second discharge opening 58*b* close to the side wall 55. The other end of the inner wall 67*a* is connected to one end of the inner wall 67*b*. The inner wall 67*b* extends to the side wall 53 along the front-back direction.

The distance between the inner wall 66*a* and the inner wall 67*a* in the left-right direction decreases as they become closer to the second discharge opening 58*b*. The distance between the inner wall 66*b* and the inner wall 67*b* in the left-right direction remains approximately unchanged even if the positions thereof in the front-back direction are changed. With the above-described configuration, the flow path S21, the flow path S22 and two regions where a gas does not flow are formed in the retreat space S2. In the retreat space S2, the flow path S21 is a region between the side wall 52 and a virtual plane connecting a connection portion of the inner wall 66*a* with respect to the inner wall 66*b* and a connection portion of the inner wall 67*a* with respect to the inner wall 67*b*. In the retreat space S2, the flow path S22 is a region between the virtual plane and the second discharge opening 58*b*. The two regions where a gas does not flow refer to regions other than the flow path S21 and the flow path S22 in the retreat space S2.

When viewed from the top, at least a part of the flow path S22 is provided overlapping the heating unit 42. When viewed from the top, the boundary between the flow path S21 and the flow path S22 overlaps the heating unit 42. In the processing space S1, the flow path is narrowed at a region near the first discharge opening 58*a* and around the heating unit 42, whereas in the retreat space S2, the flow path is narrowed at a position overlapping the heating unit 42. In the regions where a gas does not flow in the retreat space S2, wiring, sensors and the like may be provided.

<Shutter Unit>

Figures 10A, 10B:
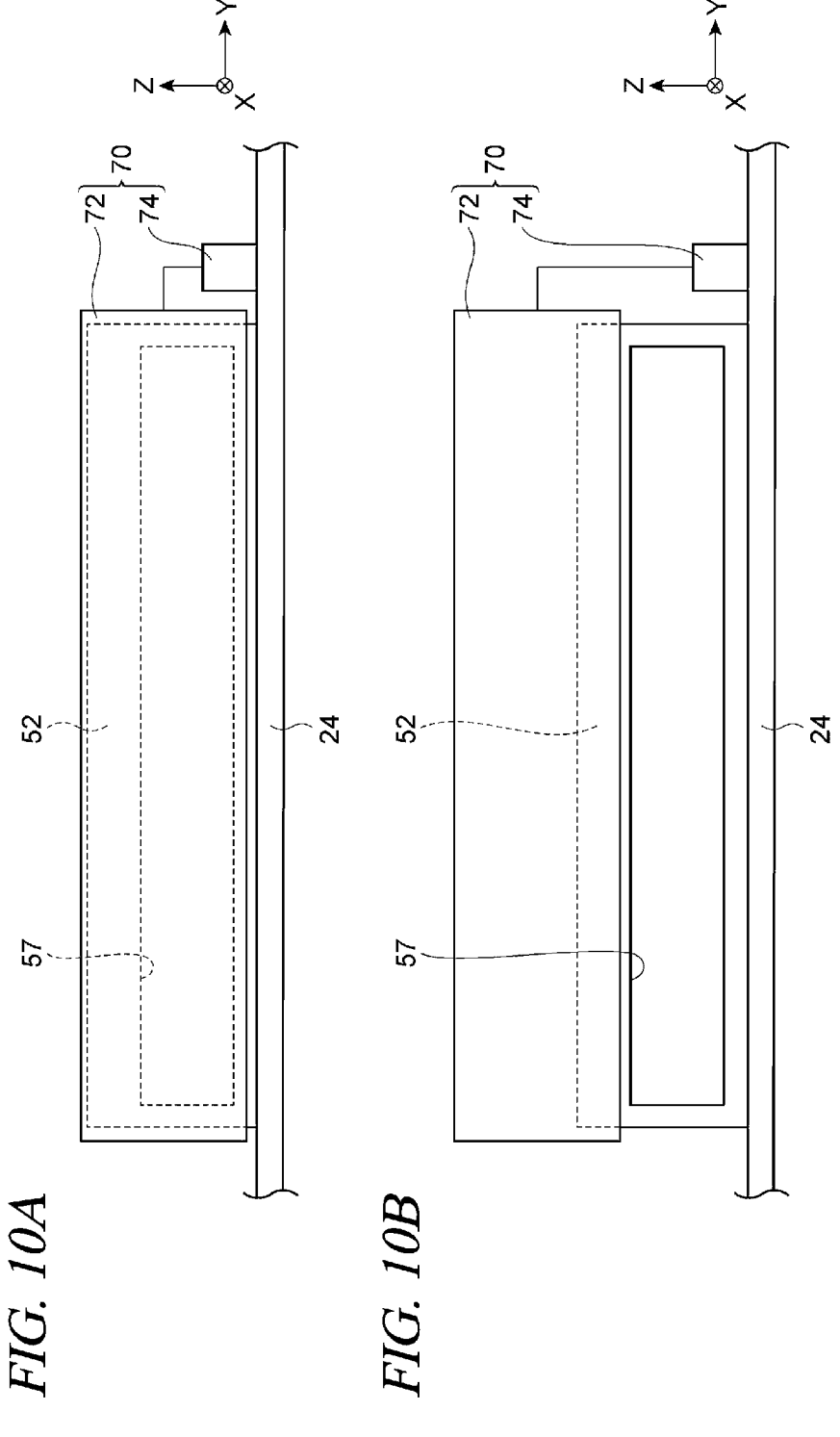
FIG. 10A and FIG. 10B are schematic side views illustrating an example of a shutter unit.

FIG. 10A and FIG. 10B illustrate an example operation of the shutter unit 70. The shutter unit 70 is located to cover the side of the carry-in/out opening 57 formed in the side wall 52. The shutter unit 70 may be provided in the base 24. The shutter unit 70 includes, for example, a shutter member 72 and a driver 74.

The shutter member 72 is configured to cover the side of the carry-in/out opening 57. The shutter member 72 is formed into a plate shape and extends along a plane (Y-Z plane in the drawings) intersecting the front-back direction. When viewed from the front-back direction, the shutter member 72 has a greater size than the carry-in/out opening 57. The driver 74 includes a driving source such as an electric motor or a cylinder, and moves the shutter member 72 in the vertical direction. When the shutter member 72 is driven by the driver 74, a closed state where the carry-in/out opening 57 is covered from the side and an open state where the carry-in/out opening 57 is opened are switched.

When the shutter member 72 is located at a position closest to the base 24 by the driver 74, the shutter member 72 covers the entire area of the carry-in/out opening 57 and the carry-in/out opening 57 is put in the closed state when viewed from the side. In this case, the inner space S is formed by an inner wall of the shutter member 72 and the chamber 50 in the chamber 50. When the shutter member 72 is located at a position farthest from the base 24 by the driver 74, the shutter member 72 does not overlap the carry-in/out opening 57 and the carry-in/out opening 57 is put in the open state when viewed from the side. As described above, the shutter member 72 switches between the closed state where the carry-in/out opening 57 is covered from the side and the open state where the carry-in/out opening 57 is opened.

Figure 11:
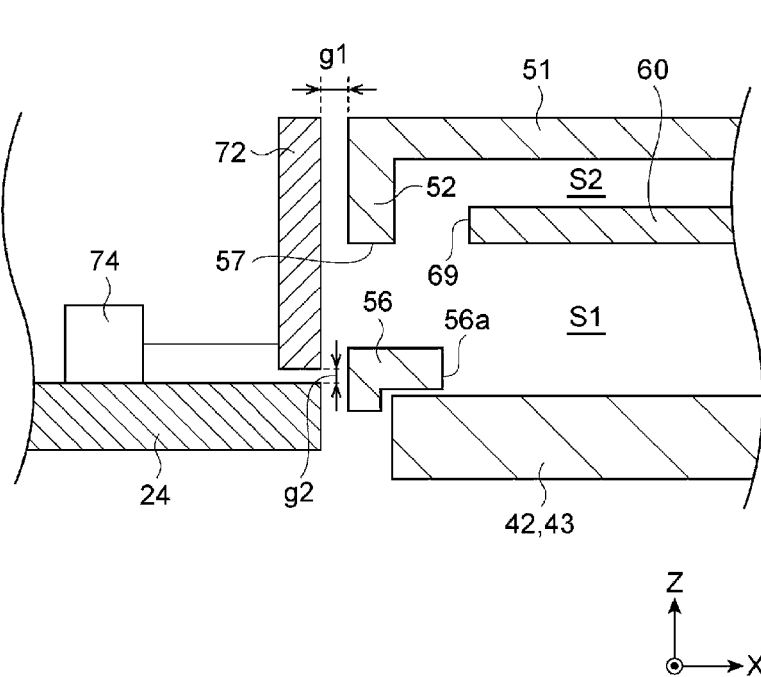
FIG. 11 is a schematic side view illustrating an example of the shutter unit and its neighboring members.

FIG. 11 is a schematic side view illustrating the shutter member 72 and a part of the chamber 50. The shutter member 72 may be provided in the base 24 except a connection portion with respect to the driver 74 so as not to be in contact with the other members. The shutter member 72 is provided at a gap g1 with the side wall 52 of the chamber 50. There is a gap between the shutter member 72 and the bottom wall 56. In either of the closed state and the open state, the shutter member 72 is not in contact with the chamber 50.

The shutter member 72 in the closed state (closest to the base 24) is provided at a gap g2 with the base 24. The gap g2 is formed under the shutter member 72. The gap g1 may be greater than the gap g2. For example, the gap g1 (the size of the gap g1) is from about 0.8 mm to about 1.6 mm, and the gap g2 (the size of the gap g2) is from about 0.2 mm to about 0.7 mm. Also, the base 24 may be equipped with a support that supports a part of a lower surface of the shutter member 72. In this case, the gap g2 corresponds to a space except the support between the lower surface of the shutter member 72 and the base 24.

<Exhaust Unit>

Figure 12:
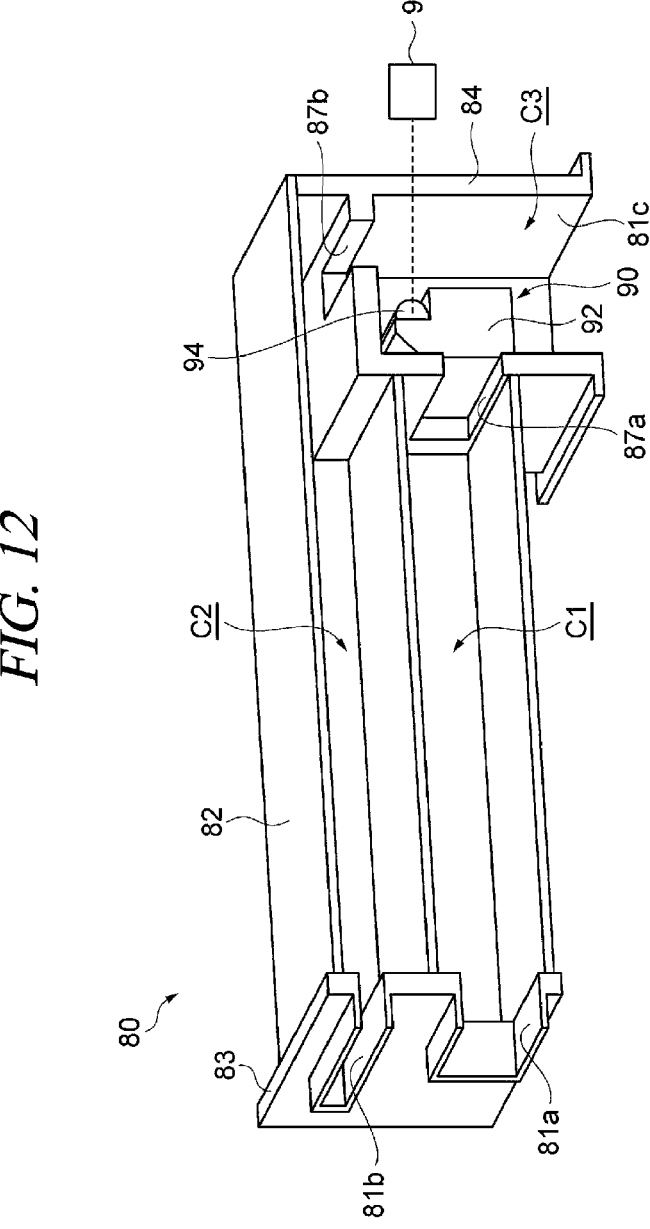
FIG. 12 is a schematic perspective view illustrating an example of an inside of the exhaust unit.

FIG. 12 is a schematic diagram illustrating an example of the inside of the exhaust unit 80 and an example of the switching unit 90. The exhaust unit 80 is configured to discharge a gas from each of the processing space S1 and the retreat space S2. The exhaust unit 80 includes a pipe 82 and a pipe 84. The pipe 82 is a member that forms a channel C1 and a channel C2. The channel C1 (first channel) is connected to the first discharge opening 58*a* opened to the processing space S1, and an exhaust gas discharged from the processing space S1 flows through the channel C1. The channel C2 (second channel) is connected to the second discharge opening 58*b* opened to the retreat space S2, and an exhaust gas discharged from the retreat space S2 flows through the channel C2.

The pipe 82 extends, for example, in the front-back direction. The channel C1 and the channel C2 are arranged in the vertical direction. A connection port 81*a* connected to the first discharge opening 58*a* is provided at an upstream end of the channel C1, and a connection port 81*b* connected to the second discharge opening 58*b* is provided at an upstream end of the channel C2. In the present disclosure, the terms "upstream" and "downstream" are used based on the flowing direction of a gas. As the gas is exhausted by the exhaust unit 80, the gas flows from the upstream side toward the downstream side in the chamber 50 and in the exhaust unit 80.

The pipe 84 is a member that forms a common channel C3 connected to each of the channel C1 and the channel C2. The common channel C3 is connected to the channel C1 via a connection port 87*a* provided at a downstream end of the channel C1 and connected to the channel C2 via a connection port 87*b* provided at a downstream end of the channel C2. The connection port 87*a* may be an opening penetrating through the inner wall in the front-back direction, and the connection port 87*b* may be an opening penetrating through the inner wall in the vertical direction. The connection port 87*b* is located at a downstream side relative to the connection port 87*a* in the front-back direction and located higher than the connection port 87*a*.

In the common channel C3, the exhaust gas introduced from the channel C1 or the channel C2 may flow downwards. A downstream end of the common channel C3 (a discharge port 81c formed at a lower end portion of the pipe 84) is connected to another exhaust pipe. The other exhaust pipe may be connected to pipes of the exhaust units in the plurality of heat treatment units U2. During the operation of the coating and developing apparatus 2, the gas is continuously exhausted from the other exhaust pipe through the discharge port 81c and the common channel C3.

The exhaust unit 80 (the pipe 82) is mounted to the side wall 53 of the chamber 50 via a fixing member. The exhaust unit 80 can be detachably attached to the chamber 50. In other words, the exhaust unit 80 is separably mounted to the chamber 50. As shown in FIG. 4 or FIG. 5, the exhaust unit 80 includes a flange 83 and a pair of mounting members 88. The flange 83 is formed at an upstream end of the pipe 82 and extends outwards from an outer wall of the pipe 82. When viewed from the front-back direction, an outer periphery of the flange 83 may have a rectangular shape (see FIG. 12).

The pair of mounting members 88 extend from left and right end portions of the flange 83 toward a downstream side. Each of the pair of mounting members 88 is provided away from the pipe 82. Each of the mounting members 88 has a gap with the pipe 82 in the left-right direction. A fixing member 89 that fixes the chamber 50 and the exhaust unit 80 is mounted to each of the pair of mounting members 88. The fixing member 89 may be any member as long as it can fix the chamber 50 and the exhaust unit 80.

The fixing member 89 includes, for example, a hook portion. When the hook portion is insertion-fitted to a receiving portion formed at the side of the protrusion of the side wall 53 of the chamber 50, the fixing member 89 fixes the chamber 50 and the exhaust unit 80 to each other. When the fixing member 89 fixes the chamber 50 and the exhaust unit 80, the fixing member 89 may be switched to a fixed state by manipulation of an operator. When the fixing between the chamber 50 and the exhaust unit 80 is released, the fixing member 89 may be switched to a released state by manipulation of the operator. Unlike the above-described example, the exhaust unit 80 may be integrally formed with the chamber 50.

<Switching Unit>

Referring back to FIG. 12, the switching unit 90 is provided within the exhaust unit 80. The switching unit 90 connects the channel C1 and the common channel C3 in the first exhaust state where a gas is not discharged from the retreat space S2 but discharged through the processing space S1. When the gas is continuously exhausted from the common channel C3 and the switching unit 90 opens the channel C1 and closes the channel C2, the gas is not discharged from the retreat space S2 but discharged from the processing space S1. The switching unit 90 connects the channel C2 and the common channel C3 in the second exhaust state where the gas is not discharged from the processing space S1 but discharged through the retreat space S2. When the gas is continuously exhausted from the common channel C3 and the switching unit 90 opens the channel C2 and closes the channel C1, the gas is not discharged from the processing space S1 but discharged from the retreat space S2.

The switching unit 90 includes, for example, a closing member 92, a shaft member 94 and a driver 96. The closing member 92 is configured to close each of (either of) the connection port 87a between the channel C1 and the common channel C3 and the connection port 87b between the channel C2 and the common channel C3. The closing member 92 is connected to the shaft member 94. The shaft member 94 extends in the left-right direction and is rotatable around its central axis line.

The driver 96 includes a driving source such as an electric motor, and rotates the shaft member 94 around the axis line. When the shaft member 94 rotates, the closing member 92 rotates around the central axis line. The closing member 92 rotates around the central axis line between a first position where the closing member 92 closes the connection port 87b and a second position where the closing member 92 closes the connection port 87a.

When the closing member 92 is located at the first position where the closing member 92 closes the connection port 87b, the channel C1 is opened to (connected to) the common channel C3 and the channel C2 is closed. Thus, it becomes the first exhaust state where the gas is not discharged from the retreat space S2 through the second discharge opening 58b and the channel C2 but discharged from the processing space S1 through the first discharge opening 58a and the channel C1.

When the closing member 92 is located at the second position where the closing member 92 closes the connection port 87a, the channel C2 is opened to (connected to) the common channel C3 and the channel C1 is closed. Thus, it becomes the second exhaust state where the gas is not discharged from the processing space S1 through the first discharge opening 58a and the channel C1 but discharged from the retreat space S2 through the second discharge opening 58b and the channel C2. As described above, when the closing member 92 of the switching unit 90 is switched in position, the first exhaust state and the second exhaust state are switched. The closing member 92 is configured to open the channel C1 and close the channel C2 in the first exhaust state, and configured to close the channel C1 and open the channel C2 in the second exhaust state.

(Attachment and Detachment of Chamber)

FIG. 13, FIG. 14, FIG. 15A and FIG. 15B illustrate examples of attachment and detachment of the chamber 50. The chamber 50 is configured to be detachably attached to a base member of the heat treatment unit U2. The base member of the heat treatment unit U2 is a member that fixes or supports various members at respective predetermined positions in the heat treatment unit U2. In the heat treatment unit U2, the heating unit 42 is provided in the base member and the shutter unit 70 (the shutter member 72) is provided in the base member. The base member of the heat treatment unit U2 includes, for example, the housing 20, the base 24 and the base 25. The chamber 50 is separably mounted to the base member of the heat treatment unit U2. When the chamber 50 is separated, the heating unit 42 and the shutter unit 70 remains on the base member.

The top plate 51, the side walls 52, 53, 54 and 55 and the bottom wall 56 of the chamber 50 are integrally formed (as one body) and thus can be separated from the base member and can be mounted to the base member. That is, in a state where the top plate 51, the side walls 52 to 55 and the bottom wall 56 are connected to each other, the entire chamber 50 can be separated from the base member and can be mounted to the base member. In a state where the partition unit 60 is fixed to the chamber 50, the partition unit 60 is movable together with the chamber 50 with respect to the base member. That is, when the chamber 50 is separated, the partition unit 60 is also separated, and when the chamber 50 is mounted, the partition unit 60 is also mounted.

When the chamber 50 is located at an installation position in the heat treatment unit U2 and fixed to the base member by a fixing member such as a bolt or the like, the chamber 50 may be mounted to the base member. When the chamber 50 is located at the installation position, an inner space of the chamber 50 surrounds the heating unit 42 (the workpiece W on the heating unit 42), and, thus, the above-described inner space S may be formed. When the fixing by the fixing member is released and the chamber 50 is moved from the installation position (for example, moved to the outside of the housing 20), the chamber 50 may be separated from the base member. The chamber 50 may be mounted and separated by the operator using a jig.

The heat treatment unit U2 includes a guide unit 210. The guide unit 210 is a member that guides the movement of the chamber 50 in a predetermined direction along an upper surface of the heating unit 42 (or the upper surface of the hot plate 43). The direction in which the chamber 50 is guided by the guide unit 210 (hereinafter, referred to as "driving direction") may be the front-back direction. In this case, when the chamber 50 is separated, it may be separated from the base member while sliding in the front-back direction, and when the chamber 50 is mounted, it may be mounted to the base member while sliding in the front-back direction. If the driving direction is the front-back direction, the exhaust unit 80 discharges a gas from the inner space S of the chamber 50 so that the gas can flow toward one side along the driving direction.

When the chamber 50 is mounted, the guide unit 210 guides the chamber 50 moving toward the installation position. When the chamber 50 is mounted, the chamber 50 slides in a direction from the heating unit 42 toward the shutter unit 70 so as to be mounted to the installation position. When the chamber 50 is separated, the guide unit 210 guides the chamber 50 moving from the installation position. When the chamber 50 is separated, the chamber 50 slides in a direction from the shutter unit 70 toward the heating unit 42 so as to be taken out of the housing 20.

Figure 13:
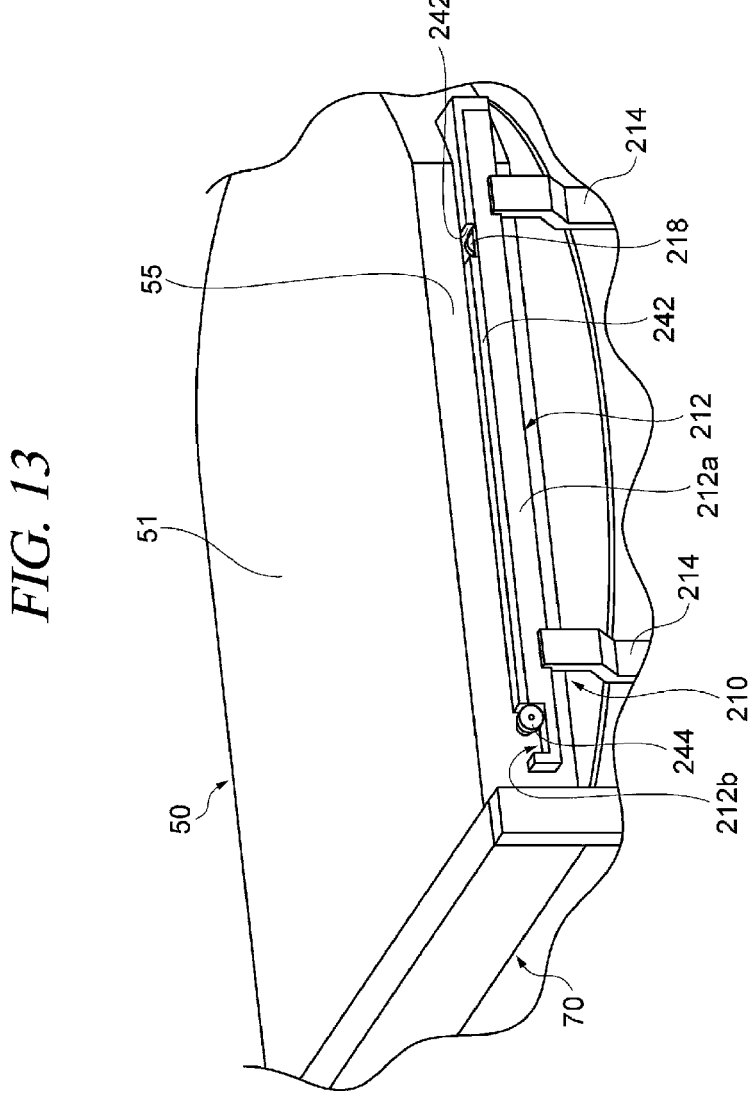
FIG. 13 is a schematic perspective view illustrating an example of a state where the chamber is mounted.

The guide unit 210 includes a rail member 212 and fixing members 214 and 214. The rail member 212 extends along the driving direction. The rail member 212 may extend along the front-back direction. The rail member 212 is located at an outer side than the chamber 50 in the left-right direction. As shown in FIG. 13, when the chamber 50 is located at the installation position, the rail member 212 is provided to face a side wall (for example, the side wall 55) on one side of the chamber 50 in the left-right direction. The length of the rail member 212 in the front-back direction may be equal to the length of the side wall 55 of the chamber 50.

The fixing members 214 and 214 are configured to fix the rail member 212 to the base member. The rail member 212 is supported by the fixing members 214 and 214 and thus is fixed at a predetermined position in the housing 20. The heat treatment unit U2 may include another guide unit 210, or a pair of guide units 210 may be provided with the heating unit 42 and the chamber 50 interposed therebetween in the left-right direction.

A protrusion 242 and a roller 244 are provided on an outer wall of the chamber 50 (for example, an outer surface of the side wall 55) in the left-right direction. The protrusion 242 protrudes outwards from the side wall of the chamber 50 and extends along the driving direction. The roller 244 is a member that is rotatable with respect to the chamber 50. The roller 244 is provided to be arranged with the protrusion 242 in the driving direction, and is located closer to the shutter unit 70 (the side wall 52 where the carry-in/out opening 57 is formed) than the protrusion 242. That is, in a state where the chamber 50 is located at the installation position, the shutter unit 70 (or the side wall 52), the roller 244 and the protrusion 242 are arranged in this order in the front-back direction.

Figure 15A:
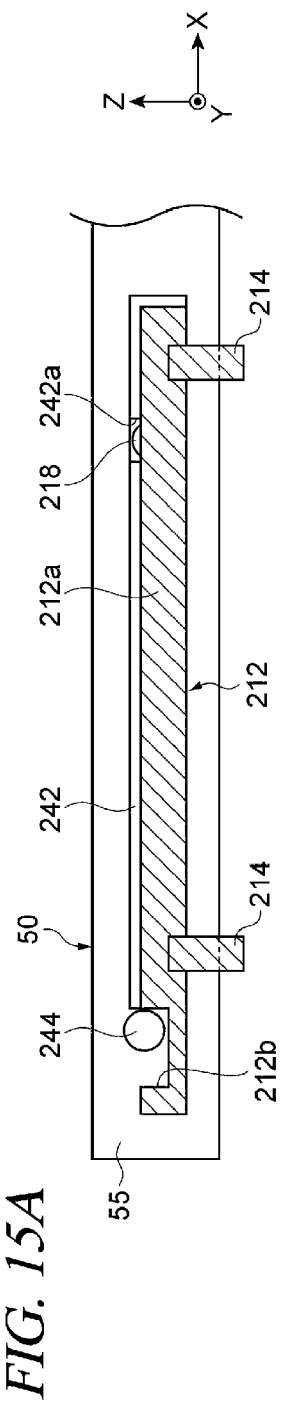
FIG. 15A and FIG. 15B are schematic side views illustrating an example of attachment and detachment of the chamber.

The rail member 212 includes a rail main body 212a and a recess 212b that is recessed downwards from an upper surface of the rail main body 212a. The recess 212b is formed at an end portion of the rail member 212 (the rail main body 212a) close to the shutter unit 70. FIG. 13 or FIG. 15A illustrates an example of a state where the chamber 50 is located at the installation position. When the chamber 50 is located at the installation position, a lower surface of the protrusion 242 is supported by the rail main body 212a, and the roller 244 provided in the chamber 50 is accommodated in the recess 212b.

The guide unit 210 may be equipped with a roller 218. The roller 218 is provided on an inner surface of the rail main body 212a (a surface facing the side wall of the chamber 50). The roller 218 is rotatable with respect to the rail member 212. The roller 218 is located at a different position from the recess 212b in the driving direction. The protrusion 242 provided in the chamber 50 includes an accommodation portion 242a where the roller 218 is accommodated when the chamber 50 is located at the installation position. With the above-described configuration, when the chamber 50 is located at the installation position, the roller 244 provided in the chamber 50 is accommodated in the recess 212b of the rail member 212. Also, the roller 218 provided in the rail member 212 is accommodated in the accommodation portion 242a of the protrusion 242 provided in the chamber 50.

Figure 14:
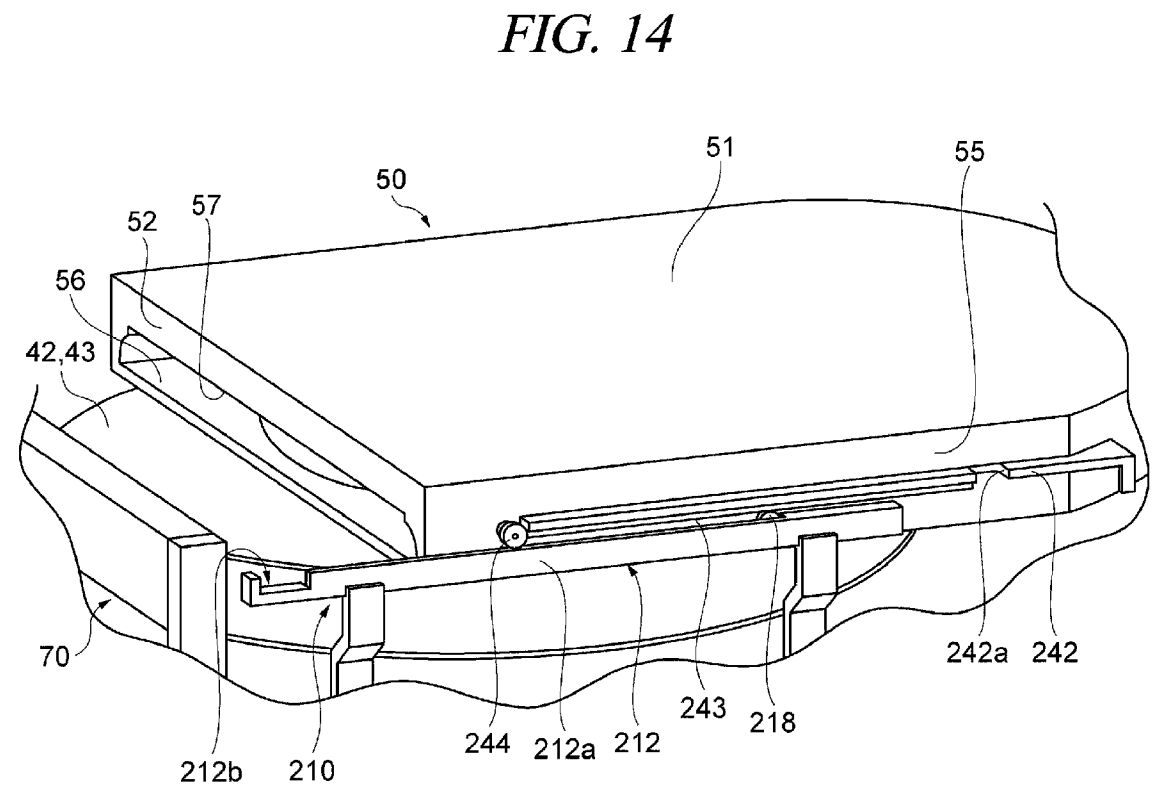
Figure 15B:
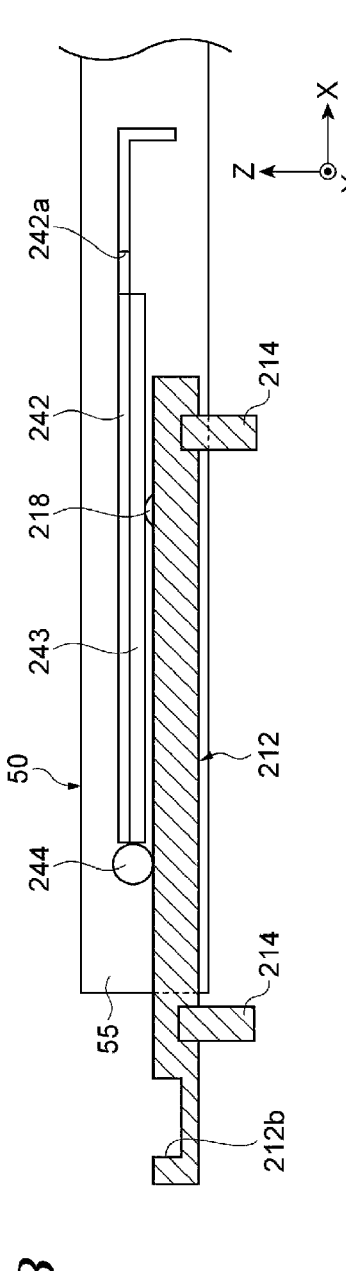

FIG. 14 or FIG. 15B illustrates an example of a state where the chamber 50 is separated from the installation position or where the chamber 50 is mounted to the installation position. When the chamber 50 moves along the driving direction, the roller 244 provided in the chamber 50 drives (moves with rotation) on the rail main body 212a. A protrusion 243 is provided under the protrusion 242 on a side surface of the chamber 50. The protrusion 243 less protrudes from the side surface of the chamber 50 than the protrusion 242.

When the chamber 50 moves, it is guided along the driving direction while the protrusion 243 is supported by the roller 218 of the guide unit 210. When the operator applies force in the driving direction while holdings one end of the chamber 50, the chamber 50 may also move along the driving direction. When the chamber 50 is attached and detached (mounted and separated), a side wall of the housing 20 where the exhaust unit 80 is located may be opened.

(Control Device)

The control device 100 is composed of one or more control computers. The control device 100 controls the switching unit 90 to switch from the second exhaust state (exhaust through the retreat space S2) to the first exhaust state (exhaust through the processing space S1) at least during heating of the workpiece W by the heating unit 42.

Figure 16:
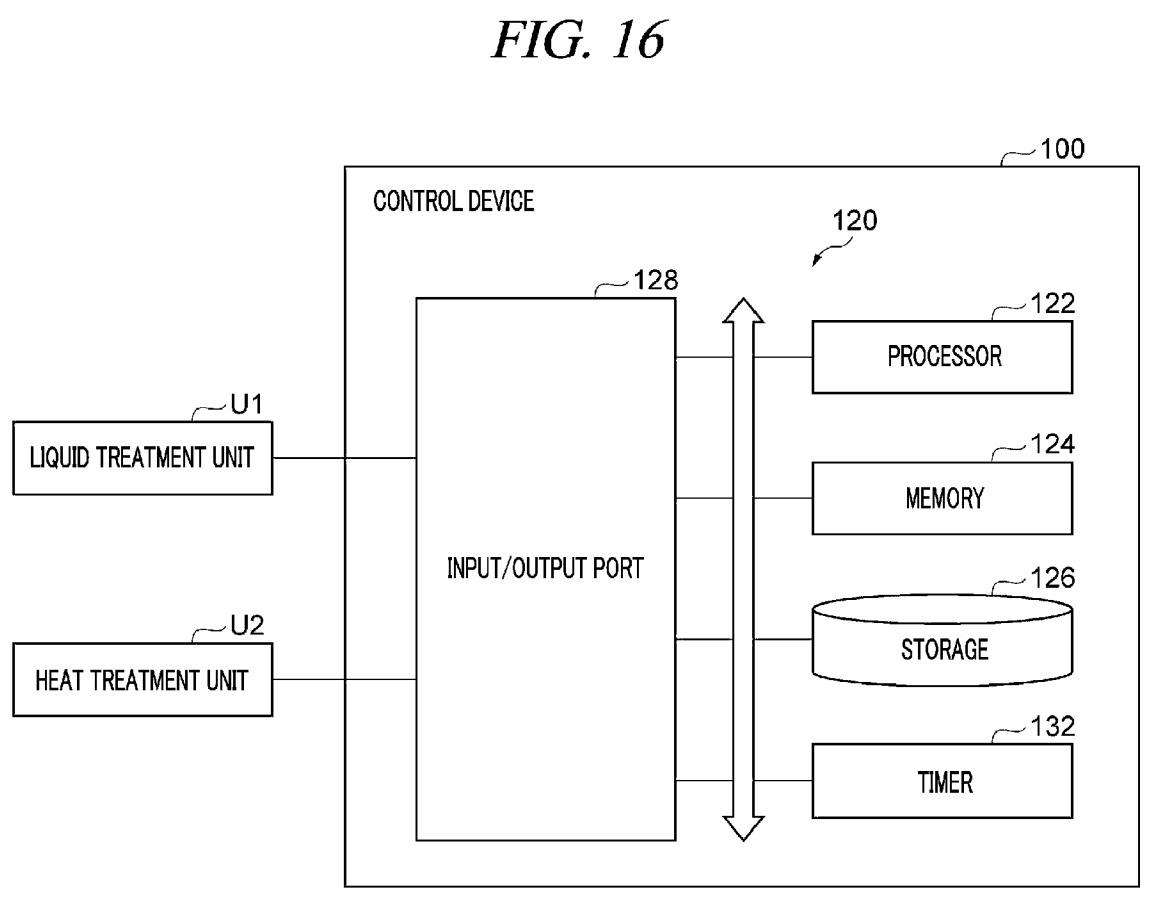

The control device 100 includes, for example, a circuit 120 show in FIG. 16. The circuit 120 is composed of one or more processors 122, a memory 124, a storage 126, an input/output port 128 and a timer 132. The storage 126 has a computer-readable recording medium such as a hard disk or the like. The recording medium stores programs for executing a substrate processing method to be described later by the control device 100. The recording medium may be implemented by a portable medium such as a non-volatile semiconductor memory, a magnetic disk or an optical disk.

The memory 124 temporarily stores thereon the programs loaded from the recording medium of the storage 126 and an operation result by the processor 122. The processor 122 executes the programs in cooperation with the memory 124. The input/output port 128 is configured to perform an input and an output of electric signals with respect to the liquid treatment unit U1 and the heat treatment unit U2 in response to instructions from the processor 122. The timer 132 measures an elapsed time by, for example, counting a reference pulse of a predetermined cycle.

[Substrate Processing Method]

Figure 17:
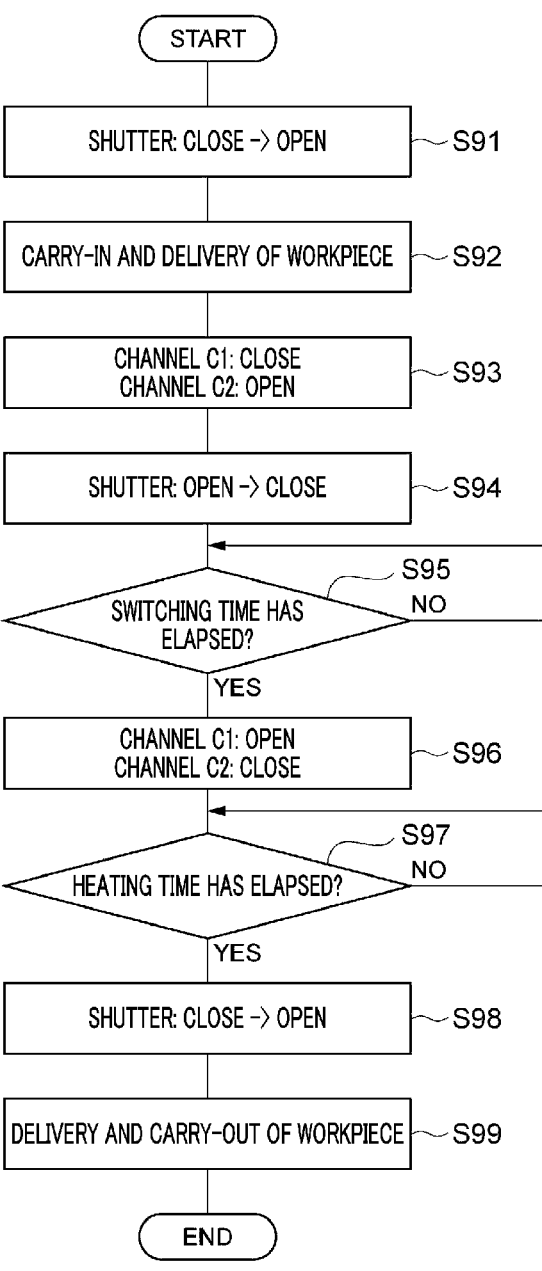
FIG. 17 is a flowchart showing an example of a series of processings performed in a heat treatment.

Hereinafter, a series of processings performed by the control device 100 in a heat treatment for the workpiece W will be described as an example of a substrate processing method (heat treatment method). The series of processings are performed in a state where a gas is continuously exhausted by the exhaust unit 80 and the hot plate 43 is continuously heated by the heater in the heating unit 42. FIG. 17 is a flowchart showing a series of processings performed by the control device 100 in a heat treatment for one workpiece W.

The control device 100 performs a process S91 first in a state where the exhaust unit 80 can exhaust a gas in the first exhaust state and the workpiece W on which a film of a processing liquid has been formed is supported on the cooling plate 31 of the transfer unit 30. In the process S91, for example, the control device 100 controls the driver 74 to raise the shutter member 72 and switches from the closed state where the carry-in/out opening 57 for the workpiece Win the chamber 50 is closed to the open state where the carry-in/out opening 57 is opened.

Figure 18A:
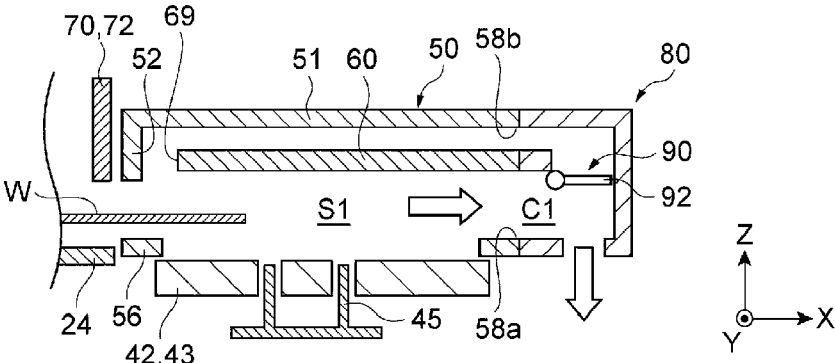
FIG. 18A and FIG. 18B are schematic diagrams illustrating an example of a heat treatment.

Then, the control device 100 performs a process S92. In the process S92, for example, the control device 100 controls the transfer unit 30 and the elevating unit 44 to carry the workpiece W into the chamber 50 from the cooling plate 31 and deliver the workpiece W from the cooling plate 31 to the heating unit 42. FIG. 18A illustrates an example of a state where the workpiece W is carried into the chamber 50. In a state where the workpiece W is delivered to the heating unit 42, the workpiece W may be located on the heating unit 42 so that the center of the heating unit 42 (the center of the hot plate 43) is approximately matched with the center of the workpiece W.

Thereafter, the control device 100 performs a process S93. In the process S93, for example, the control device 100 controls the switching unit 90 in order for the exhaust unit 80 to exhaust a gas in the second exhaust state. For example, the control device 100 drives the closing member 92 by the driver 96 to close the channel C1 connected to the processing space S1 and the first discharge opening 58a and allow the channel C2 connected to the retreat space S2 and the second discharge opening 58b to be opened to the common channel C3. Thus, the exhaust unit 80 is put in a state where a gas can be exhausted from the retreat space S2.

Subsequently, the control device 100 performs a process S94. In the process S94, for example, the control device 100 controls the shutter unit 70 to switch to the closed state where the carry-in/out opening 57 is covered from the side. The control device 100 may control the driver 74 to move the shutter member 72 downwards. When the shutter member 72 covers the carry-in/out opening 57, the inner space S in which the workpiece W is heated is formed by the shutter member 72, the heating unit 42 and the chamber 50 and heating of the workpiece W is started.

Figure 18B:
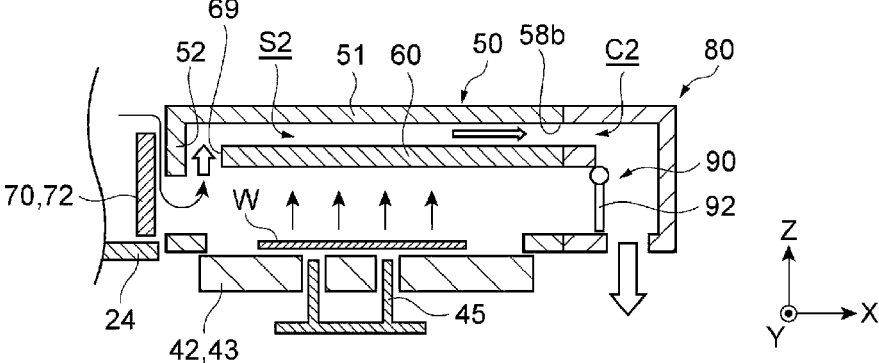

The exhaust unit 80 is put in a state where a gas can be exhausted in the second exhaust state before the shutter member 72 is closed. Therefore, when the inner space S is formed, the exhaust unit 80 discharges the gas from the retreat space S2 as shown in FIG. 18B. The gap g1 is formed between the shutter member 72 and the side wall 52, and the gas is introduced into the inner space S through the gap g1. The gas introduced into the inner space S through the gap g1 flows through the connection port 69, the retreat space S2 (the flow paths S21 and S22), the channel C2 and the common channel C3 of the exhaust unit 80. Thus, in the initial stage of the heat treatment for the workpiece W, it is possible to suppress the generation of an air flow in the processing space S1.

Then, the control device 100 performs a process S95. In the process S95, for example, the control device 100 stands by until a predetermined switching time elapses from the end time of the process S94 (heating start timing). The switching time is previously set, and may be set such that, for example, the film of the processing liquid on the workpiece W to be processed can be solidified to a certain extent. The switching time may be set to about several tens of seconds.

Figure 19:
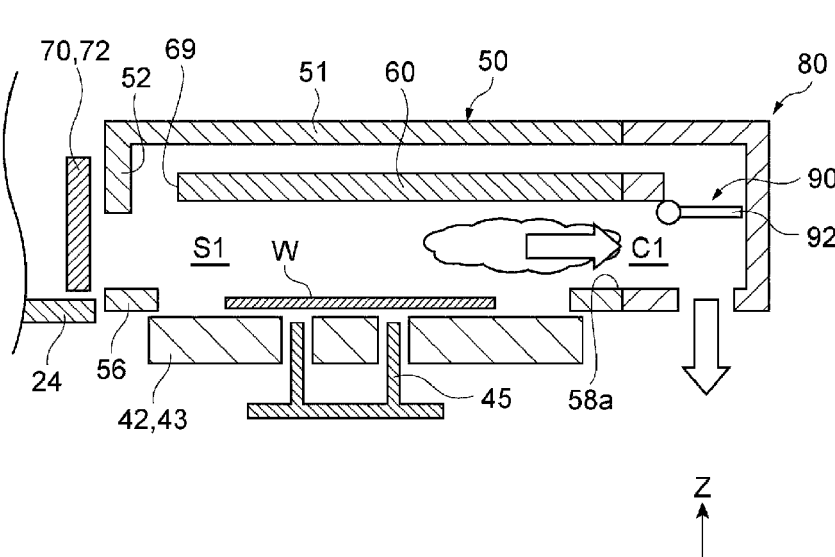
FIG. 19 is a schematic diagram illustrating an example of the heat treatment.

Thereafter, the control device 100 performs a process S96. In the process S96, for example, the control device 100 controls the switching unit 90 to switch from the second exhaust state to the first exhaust state. For example, the control device 100 drives the closing member 92 by the driver 96 to allow the channel C1 connected to the processing space S1 and the first discharge opening 58a to be opened to the common channel C3 and close the channel C2 connected to the retreat space S2 and the second discharge opening 58b. Thus, during heating of the workpiece W, exhaust by the exhaust unit 80 is performed in the first exhaust state switched from the second exhaust state. In the first exhaust state, the gas in the processing space S1 is discharged through the first discharge opening 58a and the channel C1 as shown in FIG. 19. Thus, sublimates generated in the processing space S1 during heating of the workpiece W can be discharged to the outside of the chamber 50.

Subsequently, the control device 100 performs a process S97. In the process S97, for example, the control device 100 stands by until a predetermined heating time elapses from the end time of the process S94 (heating start timing). The heating time is previously set and may be about 1.5 to 5.0 times longer than the switching time.

Then, the control device 100 performs processes S98 and S99. In the process S98, for example, the control device 100 controls the shutter unit 70 to open the carry-in/out opening 57 for the workpiece W and allow the inner space of the chamber 50 to be opened (raises the shutter member 72 by the driver 74). In the process S99, for example, the control device 100 controls the transfer unit 30 and the elevating unit 44 to deliver the workpiece W from the heating treatment unit 40 to the cooling plate 31 of the transfer unit 30 and carry the workpiece W out of the chamber 50.

In this way, the series of processings performed by the control device 100 in the heat treatment for the workpiece W are ended. The control device 100 may repeatedly perform the series of processings in the processes S91 to S99 for each of a subsequent plurality of workpieces W. The above-described series of processings are just an example and can be modified appropriately. In the above-described series of processings, the control device 100 may perform the processes in parallel, or may change the order of processes. The control device 100 may perform processings different from those described above in the respective processes.

[Maintenance Method]

When a heat treatment in the heat treatment unit U2 is repeated, sublimates adhere to a portion of the chamber 50 and the partition unit 60 that partitions the processing space S1. For this reason, the maintenance including cleaning of the chamber 50 and the partition unit 60 needs to be performed regularly. A maintenance method to be described below is performed by the operator while the coating and developing apparatus 2 (the substrate processing system 1) is not operated.

Figure 20A:
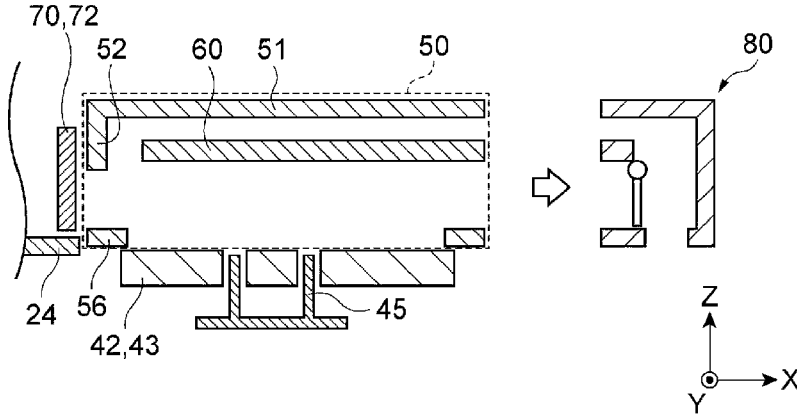
FIG. 20A and FIG. 20B are schematic diagrams illustrating an example of a state where the chamber is being separated.

First, the operator performs a process of separating the exhaust unit 80 from the chamber 50. For example, the operator releases a locked state of the fixing member 89 mounted to the mounting members 88 of the exhaust unit 80 and then separates the exhaust unit 80 from the chamber 50. The operator may also separate the exhaust unit 80 from another pipe (for example, a pipe where exhaust gases from a plurality of heat treatment units U2 join) connected to the common channel C3 of the exhaust unit 80. FIG. 20A illustrates an example of a state where the exhaust unit 80 is being separated from the chamber 50.

Then, the operator performs a process of separating the chamber 50 from the base member of the heat treatment unit U2. When the chamber 50 is separated, the partition unit 60, the flow path control unit 62 and the flow path forming members 66 and 67 are also separated. For example, the operator releases the locked state made by a fixing member, such as a bolt, fixing the chamber 50 and the base member. Thus, the chamber 50 is put in a state where it is movable with respect to the base member.

Figure 20B:
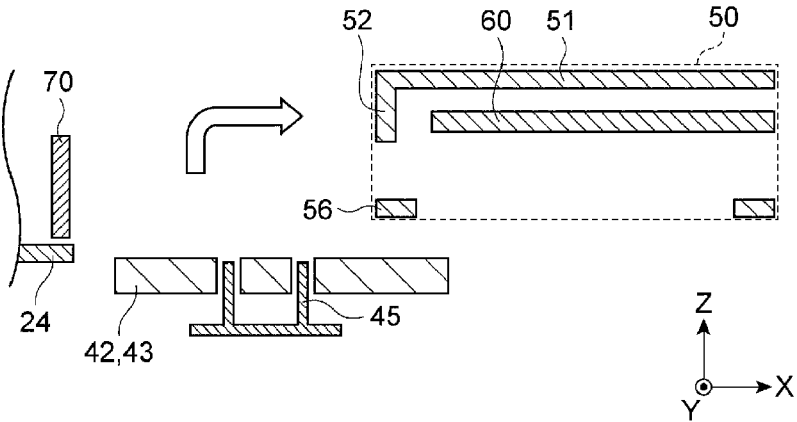

Further, the operator slides the chamber 50 in a direction away from the shutter unit 70 while upwardly raising the chamber 50 at the installation position. The operator raises the chamber 50 so that the roller 244 accommodated in the recess 212b of the rail member 212 can be located on the rail main body 212a of the rail member 212 and the protrusion 243 can be located on the roller 218. Thereafter, the operator slides the chamber 50 along the guide unit 210 in the front-back direction to be taken out of the heat treatment unit U2. FIG. 20B illustrates an example of a state where the chamber 50 is separated by being raised once and then slid in the front-back direction.

Then, the operator performs a process of cleaning the inside of the chamber 50 to remove sublimates adhering to the inside of the chamber 50. After the cleaning process, the operator performs a process of installing (mounting) the chamber 50 into the heat treatment unit U2. The process of mounting the chamber 50 is performed in a reverse order of the process of separating the chamber 50. The operator slides the chamber 50 along the guide unit 210 toward the shutter unit 70 until the roller 244 is accommodated in the recess 212b and the roller 218 is accommodated in the accommodation portion 242a. Thus, the chamber 50 is located at the installation position. Then, the operator fixes the chamber 50 to the base member of the heat treatment unit U2 with a fixing member such as a bolt or the like.

Subsequently, the operator mounts the exhaust unit 80 to the chamber 50 and also mounts the common channel C3 of the exhaust unit 80 to another pipe. In this way, the maintenance operation for one heat treatment unit U2 is ended.

[Other Examples of Chamber]

Figure 21:
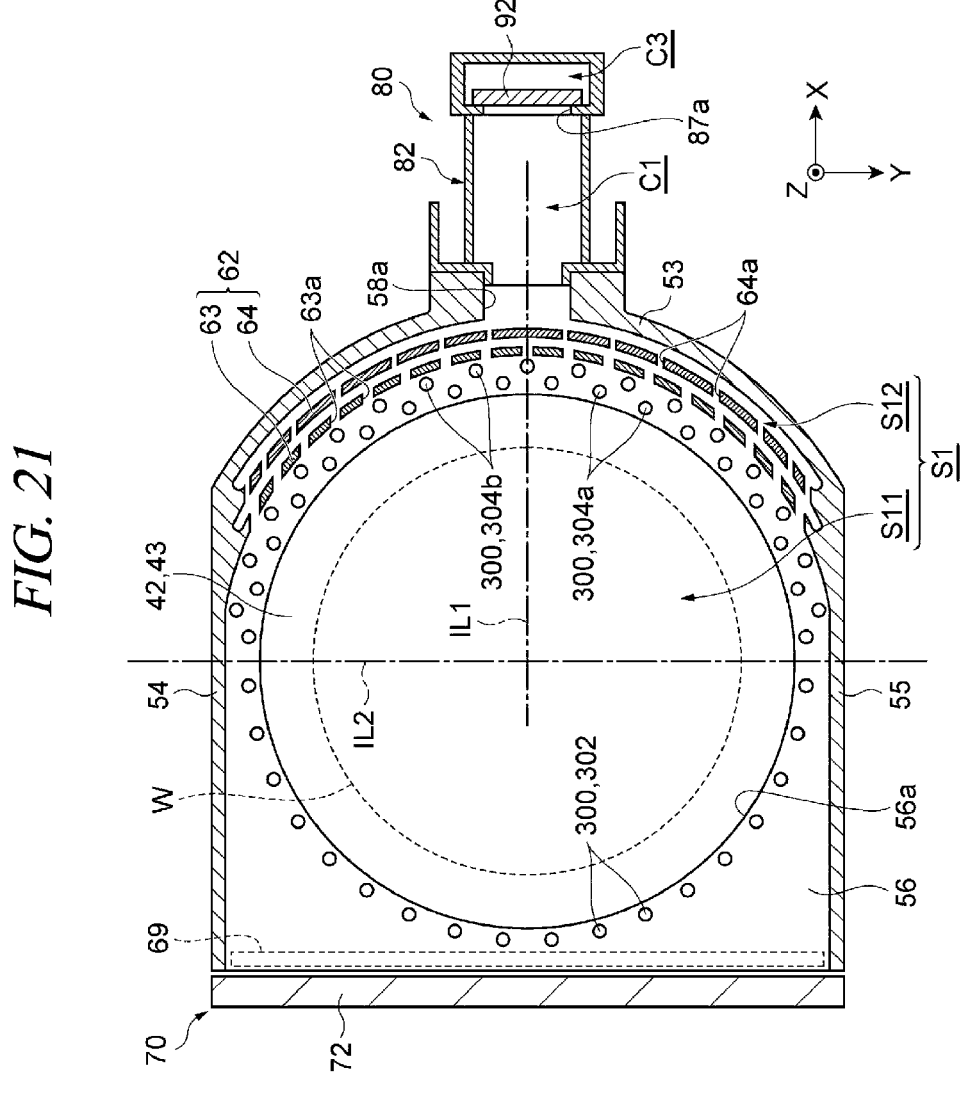
FIG. 21 is a schematic top view illustrating an example of the inside of the chamber.

The bottom wall 56 constituting the chamber 50 may include a plurality of inlet holes that connects the processing space 51 in the chamber 50 to the outside of the chamber 50. FIG. 21 is the cross-sectional view taken along the line A-A of FIG. 3, as in FIG. 7. As shown in FIG. 21, a plurality of inlet holes 300 may be formed in the bottom wall 56 so as to be arranged around the workpiece W supported by the heating unit 42 (the hot plate 43). Each of the plurality of inlet holes 300 penetrates through the bottom wall 56 in a direction (for example, vertical direction) intersecting the bottom wall 56. Since each of the plurality of inlet holes 300 penetrates through the bottom wall 56, a gas can be introduced from a space outside the chamber 50 into the processing space S1 inside the chamber 50 through the plurality of inlet holes 300. Each of the plurality of inlet holes 300 may have a circular shape (when viewed from the top), or may have an oval shape or a polygonal shape other than the circular shape.

At least some of the plurality of inlet holes 300 may be located at different positions in a circumferential direction around the center of the heating unit 42. At least some of the plurality of inlet holes 300 may be arranged on a circumference around the center of the heating unit 42. The plurality of inlet holes 300 (some of the plurality of inlet holes 300) on the circumference may be arranged at an equal distance from each other. Some of the plurality of inlet holes 300 may be different in distance from the center of the heating unit 42. When the heating unit 42 is viewed from the top, the plurality of inlet holes 300 is located at an outer side than a periphery of the workpiece W being supported on the heating unit 42. When the heating unit 42 is viewed from the top, the plurality of inlet holes 300 is located at an outer side than an opening at the gap between the heating unit 42 and the bottom wall 56 in the processing space S1. The plurality of inlet holes 300 may be formed to overlap the peripheral portion (a periphery and its surroundings) of the heating unit 42, or may be located at an outer side than the periphery of the heating unit 42.

Each of the plurality of inlet holes 300 may have the same opening area. The opening area of each inlet hole 300 refers to an area of a region defined by an opening edge of the inlet hole 300 in the upper surface of the bottom wall 56. The diameter of each of the plurality of inlet holes 300 may be greater than a size of a gap g3 formed between the bottom wall 56 and the heating unit 42 (see FIG. 22B). The size of the gap g3 is defined as the shortest distance between bottom wall 56 and the heating unit 42.

Herein, assuming that a first region and a second region are a pair of virtual regions defined as below, the plurality of inlet holes 300 may be formed in the bottom wall 56 so that the sum (sum value) of the opening areas is smaller in the first region than in the second region. When the heating unit 42 is viewed from the top, the first region and the second region are a pair of virtual regions obtained by dividing the processing space S1 around the center of the heating unit 42 into two parts in a direction connecting the center of the heating unit 42 and the center of the discharge opening 58. In FIG. 21, a virtual line connecting the center of the heating unit 42 and the center of the discharge opening 58 when the heating unit 42 is viewed from the top is indicated as "IL1". Also, a virtual line which passes through the center of the heating unit 42 and is orthogonal to the virtual line IL1 is indicated as "IL2". An intersection between the virtual line IL1 and the virtual line IL2 is matched with the center of the heating unit 42.

When the heating unit 42 is viewed from the top, the first region is close to the shutter unit 70 (the carry-in/out opening 57) between the pair of regions of the processing space S1 divided by the virtual line L2 as a boundary. The second region is close to the discharge opening 58 (the exhaust unit 80) between the pair of regions. The shutter unit 70, the first region, the second region and the discharge opening 58 (the exhaust unit 80) are arranged in this order in the front-back direction (in an extension direction of the virtual line IL1). When the heating unit 42 is viewed from the top, the connection port 69 that connects the processing space S1 and the retreat space S2 overlaps the first region.

In FIG. 21, the position of the connection port 69 when viewed from the top is near the shutter member 72 as indicated by a dashed line.

Two or more inlet holes 300 are formed in each of the first region and the second region. The sum of the opening areas of the plurality of inlet holes 300 in the second region is greater than the sum of the opening areas of the plurality of inlet holes 300 in the first region. If there is an inlet hole 300 overlapping the virtual line IL2, a portion of the inlet hole 300 present in the first region is included in the sum of the opening areas in the first region and a portion of the inlet hole 300 present in the second region is included in the sum of the opening areas in the second region.

When each of the plurality of inlet holes 300 has the same opening area, the number of the plurality of inlet holes 300 formed in the second region may be greater than the number of the plurality of inlet holes 300 formed in the first region. When the number of the plurality of inlet holes 300 in the first region is equal to the number of the plurality of inlet holes 300 in the second region, each of the inlet holes 300 in the second region may have a greater opening area than each of the inlet holes 300 in the first region. Both the number of inlet holes 300 and the opening area of each inlet hole 300 may be regulated so that the sum of the opening areas in the first region and the sum of the opening areas in the second region satisfy the above-described relation.

In the example shown in FIG. 21, a plurality of inlet holes 302 is formed in the first region, and a plurality of inlet holes 304*a* and a plurality of inlet holes 304*b* are formed in the second region. The plurality of inlet holes 302 and the plurality of inlet holes 304*a* are arranged on the same circumference around the center of the heating unit 42. The number of the plurality of inlet holes 302 is equal to the number of the plurality of inlet holes 304*a*. Each of the plurality of inlet holes 302 has the same opening area, and each of the plurality of inlet holes 304*a* has the same opening area. The opening area of each inlet hole 302 is equal to the opening area of each inlet hole 304*a*.

The plurality of inlet holes 304*b* is arranged on an outer circumference than the plurality of inlet holes 304*a*. Each of the plurality of inlet holes 304*b* has the same opening area, and the opening area of each inlet hole 304*b* is equal to the opening area of each inlet hole 304*a*. In the configuration illustrated in FIG. 21, the sum of the opening areas of the plurality of inlet holes 304*a* and the opening areas of the plurality of inlet holes 304*b* is greater than the sum of the opening areas of the plurality of inlet holes 302. Even when the chamber 50 has the bottom wall 56 in which the plurality of inlet holes 300 is formed, the control device 100 may perform the series of processings shown in FIG. 17.

Figures 22A, 22B:
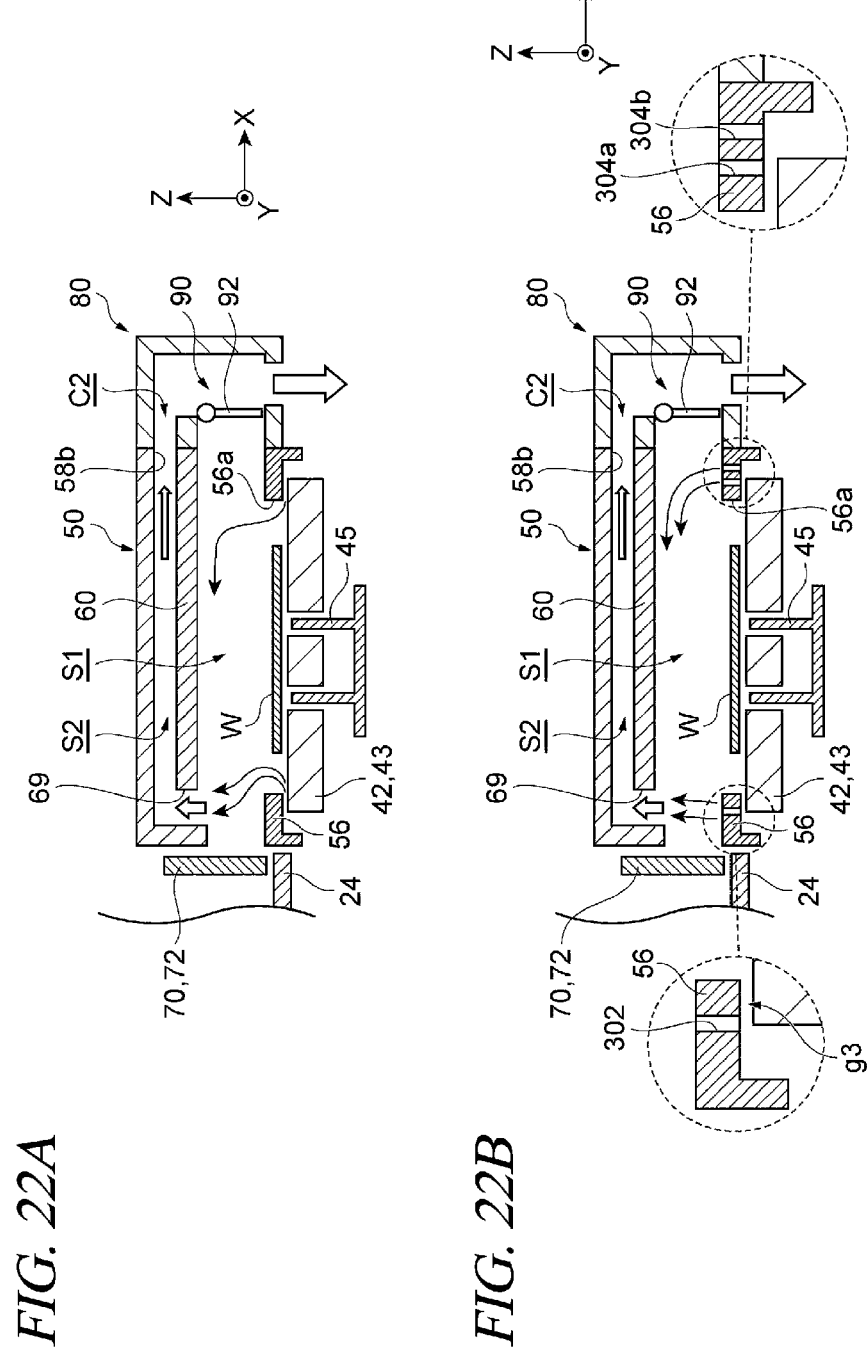
FIG. 22A is a schematic diagram illustrating an example of a heat treatment in the absence of inlet holes and FIG. 22B is a schematic diagram illustrating an example of a heat treatment in the presence of inlet holes.

FIG. 22A illustrates the chamber 50 in which the plurality of inlet holes 300 is not formed and an example of the inside of the chamber 50 in which a gas is being discharged through the retreat space S2 in the second exhaust state. As described above, the gap g3 is formed between the heating unit 42 (for example, an upper surface of the peripheral portion of the heating unit 42) and the bottom wall 56 (for example, a lower surface of the part covering the peripheral portion of the heating unit 42 from the top). In the second exhaust state, a gas in the processing space S1 is guided to the retreat space S2 through the connection port 69. In this case, a gas is introduced into the processing space S1 from the outside of the chamber 50 through the gap g3, and an air flow that can affect a peripheral portion of the workpiece W on the heating unit 42 may be generated in the processing space S1. The air flow is likely to affect a film thickness distribution (an outer peripheral portion in the film thickness distribution) of the film of the processing liquid formed on the workpiece W.

FIG. 22B illustrates the chamber 50 in which the plurality of inlet holes 300 is formed and an example of the inside of the chamber 50 in which a gas is being discharged through the retreat space S2 in the second exhaust state. Due to the plurality of inlet holes 300, at least some of a gas flowing from the gap g3 to the processing space S1 is introduced into the processing space S1 through the plurality of inlet holes 300, unlike the example shown in FIG. 22A. As a result, the amount of the gas introduced into the processing space S1 through the gap g3 decreases, which makes it difficult to generate an air flow that can affect the peripheral portion of the workpiece W on the heating unit 42 or reduces the degree of effect caused by the air flow.

As shown in FIG. 22A, the connection port 69 is formed closer to the shutter unit 70. In this case, in the second exhaust state, a flow rate of a gas introduced into the processing space S1 through the gap g3 in the first region becomes greater than a flow rate of a gas introduced into the processing space S1 through the gap g3 in the second region. Meanwhile, in the example shown in FIG. 22B, the sum of the opening areas of the plurality of inlet holes 300 in the second region is greater than the sum of the opening areas of the plurality of inlet holes 300 in the first region. Thus, the difference between a flow rate of a gas introduced into the processing space S1 through the plurality of inlet holes 300 in the second region and a flow rate of a gas introduced into the processing space S1 through the plurality of inlet holes 300 in the first region is reduced. For this reason, even if the outer peripheral portion in the film thickness distribution of the workpiece W on the heating unit 42 is somewhat affected by the gas introduced into the processing space S1 through the plurality of inlet holes 300, it is possible to reduce the difference in effect in the front-back direction.

Unlike the examples shown in FIG. 21 and FIG. 22B, the sum of the opening areas of the plurality of inlet holes 300 in the first region may be approximately identical to the sum of the opening areas of the plurality of inlet holes 300 in the second region. For example, the plurality of inlet holes 302 may be formed in the first region and the plurality of inlet holes 304*a* may be formed in the second region, but the plurality of inlet holes 304*b* may not be formed in the second region.

[Effects of Exemplary Embodiments]

The coating and developing apparatus 2 described above includes the heating unit 42, the chamber 50, the exhaust unit 80, the partition unit 60 and the switching unit 90. The heating unit 42 is configured to support and heat the workpiece W on which a film of a processing liquid is formed. The chamber 50 surrounds the workpiece W supported by the heating unit 42. The exhaust unit 80 is configured to discharge a gas from the inner space S of the chamber 50 through the discharge opening 58 located near the heating unit 42. The partition unit 60 is configured to partition the inner space of the chamber 50 into the processing space S1 where the workpiece W on the heating unit 42 is exposed and the retreat space S2 located above the processing space S1. The switching unit 90 is configured to switch between the first exhaust state where the gas is discharged through the processing space S1 by the exhaust unit 80 and the second exhaust state where the gas is discharged through the retreat space S2 by the exhaust unit 80.

While the workpiece W is heated, sublimates are generated from the processing liquid in the space where the workpiece W is exposed. If the gas is discharged from the space where the workpiece W is exposed in order to collect the sublimates, an air flow is generated above the workpiece W when the gas is discharged and may affect a film thickness distribution of the processing liquid after the heat treatment. In this regard, switching between the exhaust state where the gas is discharged through the processing space S1 and the exhaust state where the gas is discharged through the retreat space S2 is performed in the heat treatment unit U2. For this reason, while the workpiece W to be processed is heated, the gas can be discharged through the retreat space S2 in a time zone in which the air flow greatly affects the film thickness distribution and the gas can be discharged through the processing space S1 in a time zone in which the air flow less affects the film thickness distribution. Therefore, it is useful in collecting the sublimates efficiently and reducing an effect on the film thickness distribution.

The coating and developing apparatus 2 described above may further include the control device 100 configured to control the switching unit 90 to switch from the second exhaust state to the first exhaust state during heating of the workpiece W by the heating unit 42. At an early stage of heating the workpiece W to be processed, the film of the processing liquid is not sufficiently solidified, and, thus, the film thickness distribution is greatly affected by the air flow generated in the processing space S1. Meanwhile, at a late stage of heating the workpiece W, the film of the processing liquid is solidified, and, thus, the film thickness distribution is less affected by the air flow generated in the processing space S1. In the above-described configuration, the gas may be discharged in the second exhaust state at the early stage of heating the workpiece W and may be discharged in the first exhaust state at the late stage of heating the workpiece W. Therefore, it is possible to collect the sublimates efficiently and reduce the effect on the film thickness distribution (for example, improve the uniformity of the film thickness).

In the coating and developing apparatus 2 described above, the discharge opening 58 may include the first discharge opening 58a that is opened to the processing space S1 and the second discharge opening 58b that is opened to the retreat space S2. The switching unit 90 may include the closing member 92. The closing member 92 is configured to open the channel C1 connected to the first discharge opening 58a and close the channel C2 connected to the second discharge opening 58b in the first exhaust state, and configured to close the channel C1 and open the channel C2 in the second exhaust state. In this case, switching between the first exhaust state and the second exhaust state can be performed by driving the closing member 92. Therefore, a configuration of a device configured to switch the exhaust state by the exhaust device 80 can be simplified.

The coating and developing apparatus 2 described above may further include the flow path control unit 62. The flow path control unit 62 may include the inner wall 63 provided around the heating unit 42 in the processing space S1 and configured to partition the processing space S1 into the accommodation space S11 including the heating unit 42 and the control space S12 including the discharge opening 58 (the first discharge opening 58a). The inner wall 63 may include the multiple discharge holes 63a, connecting the accommodation space S11 and the control space S12, arranged in the extension direction of the inner wall 63. In this case, it is possible to control the flow of a gas for each purpose in the accommodation space S11 including the workpiece W on the heating unit 42 and the control space S12 for guiding a gas to the discharge opening 58.

In the coating and developing apparatus 2 described above, the flow path control unit 62 may further include the inner wall 64 that partitions the control space S12 into the buffer space including the inner wall 63 and the discharge space including the discharge opening 58 (the first discharge opening 58a). The inner wall 64 may include the multiple discharge holes 64a, connecting the buffer space and the discharge space, arranged in the extension direction of the inner wall 64. In this case, it is possible to control a gas flow rate in the multiple discharge holes 63a formed in the inner wall 63 provided at an inner side than the inner wall 64. By controlling the gas flow rate in the multiple discharge holes 63a, for example, the air flow above the workpiece W on the heating unit 42 can be uniform in intensity. Therefore, it is possible to improve the in-plane uniformity of the film thickness of the workpiece W.

In the coating and developing apparatus 2 described above, when the heating unit 42 is viewed from the top, the length of the inner wall 63 is greater than the length of the workpiece W on the heating unit 42 in a width direction orthogonal to the direction connecting the center of the heating unit 42 and the center of the discharge opening 58 (the first discharge opening 58a). In this case, it is possible to reduce the difference in intensity of the air flow above the workpiece W between a central portion and the other portion in the width direction. Therefore, the effect on the film thickness distribution when a gas is discharged by the exhaust unit 80 can be reduced.

In the coating and developing apparatus 2 described above, when the heating unit 42 is viewed from the top, each of the multiple discharge holes 63a may penetrate through the inner wall 63 in the direction connecting the center of the heating unit 42 and the center of the discharge opening 58 (the first discharge opening 58a). In this case, an air flow flowing from the center of the heating unit 42 in a diametrical direction is unlikely to be generated above the heating unit 42. Therefore, the effect on the film thickness distribution when a gas is discharged by the exhaust unit 80 can be reduced.

In the coating and developing apparatus 2 described above, when the heating unit 42 is viewed from the top, the inner wall 63 may extend in the circumferential direction around the center of the heating unit 42. If the inner wall 63 including the multiple discharge holes 63a extends linearly, an angled portion is formed at a downstream end of the processing space S1 and sublimates may be accumulated in the angled portion. Also, a gas may stay in the angled portion when the gas is discharged from the processing space S1. When the gas stays, the differences in conditions (intensity, direction, etc.) of the air flow generated above the workpiece W on the heating unit 42 may arise in the left-right direction. In the above-described configuration, any angled portion is not formed by the inner wall 63 extending in the circumferential direction, and, thus, it is possible to reduce the likelihood of accumulation of sublimates in the processing space S1 and the likelihood of stagnation of the air flow. Therefore, it is possible to collect the sublimates efficiently and reduce the effect on the film thickness distribution when exhaust is performed.

In the coating and developing apparatus 2 described above, when the heating unit 42 is viewed from the top, the length of the second discharge opening 58b may be smaller than the length of the heating unit 42 in a width direction orthogonal to a direction connecting the center of the heating unit 42 and the center of the second discharge opening 58b. The retreat space S2 may include the flow path S21 including the connection port 69 with respect to the processing space S1 and the flow path S22 having a smaller size than the flow path S21 in the width direction. At least a part of the flow path S22 may be provided at a position overlapping the heating unit 42. In order for the gas to smoothly flow toward the second discharge opening 58*b*, the flow path in the retreat space S2 needs to be narrowed as it is closer to the second discharge opening 58*b*. Since at least a part of the flow path S22 is provided at the position overlapping the heating unit 42, the gas can flow smoothly in the retreat space S2 and the retreat space S2 can be used efficiently.

In the coating and developing apparatus 2 described above, the carry-in/out opening 57 for the workpiece W may be provided in the side wall 52 of the chamber 50. The coating and developing apparatus 2 may further include the shutter member 72 disposed with the gap g1 therebetween with the side wall 52 and configured to switch between the closed state where the carry-in/out opening 57 is covered from the side and the open state where the carry-in/out opening 57 is opened. In the closed state, the gap g1 between the side wall 52 and the shutter member 72 may be greater than the gap g2 formed under the shutter member 72. It is easier to guide a gas introduced into the inner space S from the gap g1 beside the shutter member 72 to the retreat space S2 than to guide a gas introduced into the inner space S from the gap g2 under the shutter member 72. In the above-described configuration, the gap g2 is smaller than the gap g1, and it is easy to guide the gas introduced into the inner space S from the gap of the shutter member 72 covering the carry-in/out opening 57 to the retreat space S2. For this reason, it is difficult for the gas introduced into the inner space S to flow in the processing space S1. Therefore, the effect on the film thickness distribution when the gas is discharged by the exhaust unit 80 can be reduced.

In the coating and developing apparatus 2 described above, the chamber 50 may have the bottom wall 56 provided around the workpiece W supported by the heating unit 42 and disposed with a gap therebetween with the heating unit 42. The bottom wall 56 may include the multiple inlet holes 300, arranged around the workpiece W supported by the heating unit 42, connecting the processing space S1 to the outside of the chamber 50. When exhaust is performed by the exhaust unit 80, the film thickness at the outer peripheral portion of the film of the processing liquid formed on the workpiece W may be affected by an air flow caused by a gas introduced into the processing space S1 from the gap between the bottom wall 56 and the heating unit 42. In the above-described configuration, due to the formation of the inlet holes 300, at least some of the gas that can be introduced from the gap is introduced into the processing space S1 through the inlet holes 300. For this reason, an effect caused by the gas introduced from the gap between the bottom wall 56 and the heating unit 42 can be reduced. Therefore, the effect on the film thickness distribution when a gas is discharged by the exhaust unit 80 can be reduced.

In the coating and developing apparatus 2 described above, the multiple inlet holes 300 may be formed in the bottom wall 56 such that the sum of the opening areas of the multiple inlet holes 300 in a first region is smaller than that in the second region. When the heating unit 42 is viewed from the top, the first region and the second region are a pair of virtual regions obtained by dividing the processing space S1 into two parts with the center of the heating unit 42 as a boundary in the direction connecting the center of the heating unit 42 and the center of the discharge opening 58. When the heating unit 42 is viewed from the top, the connection port 69 between the processing space S1 and the retreat space S2 may overlap the first region. When exhaust is performed through the retreat space S2, a flow rate of a gas introduced from the inlet holes 300 may be greater in the first region than in the second region due to the connection port 69 formed at a position overlapping the first region. In the above-described configuration, the sum of the opening areas in the first region is smaller than that in the second region, and, thus, the difference in flow rate of the gas introduced from the inlet holes 300 is reduced. Thus, the difference in effect on the film thickness distribution caused by the introduction of the gas through the multiple inlet holes 300 between the first region and the second region can be reduced. Therefore, a deviation in the effect on the film thickness distribution when a gas is discharged by the exhaust unit 80 can be reduced.

[Remarks]

The present disclosure includes a configuration described in the following Remarks 1 to 12.

<Remark 1>

A heat treatment apparatus, comprising:

a heating unit configured to support and heat a substrate on which a film of a processing liquid is formed;

a chamber surrounding the substrate supported by the heating unit;

an exhaust unit configured to discharge a gas from an inner space of the chamber through a discharge opening located near the heating unit;

a partition unit configured to partition the inner space of the chamber into a first space where the substrate on the heating unit is exposed and a second space located above the first space; and a switching unit configured to switch between a first state where the gas is discharged by the exhaust unit through the first space and a second state where the gas is discharged by the exhaust unit through the second space.

<Remark 2>

The heat treatment apparatus of Remark 1, further comprising:

a controller configured to control the switching unit to switch from the second state to the first state while the substrate is heated by the heating unit.

<Remark 3>

The heat treatment apparatus of Remark 1 or 2, wherein the discharge opening includes a first discharge opening that is opened to the first space and a second discharge opening that is opened to the second space, and the switching unit includes a closing member configured to open a first channel connected to the first discharge opening and close a second channel connected to the second discharge opening in the first state, and configured to close the first channel and open the second channel in the second state.

<Remark 4>

The heat treatment apparatus of any one of Remarks 1 to 3, further comprising:

a flow path control unit, provided around the heating unit in the first space, including an inner wall that partitions the first space into an accommodation space including the heating unit and a control space including the discharge opening, wherein the inner wall includes multiple discharge holes, connecting the accommodation space and the control space, arranged in an extension direction of the inner wall.

<Remark 5>

The heat treatment apparatus of Remark 4, wherein the flow path control unit further includes a second inner wall that partitions the control space into a buffer space including the inner wall and a discharge space including the discharge opening, and the second inner wall includes multiple second discharge holes, connecting the buffer space and the discharge space, arranged in an extension direction of the second inner wall.

<Remark 6>

The heat treatment apparatus of Remark 4 or 5, wherein when the heating unit is viewed from a top, a length of the inner wall is greater than a length of the substrate on the heating unit in a width direction orthogonal to a direction connecting a center of the heating unit and a center of the discharge opening.

<Remark 7>

The heat treatment apparatus of any one of Remarks 4 to 6, wherein when the heating unit is viewed from a top, each of the multiple discharge holes penetrates through the inner wall in a direction connecting a center of the heating unit and a center of the discharge opening.

<Remark 8>

The heat treatment apparatus of any one of Remarks 4 to 7, wherein when the heating unit is viewed from a top, the inner wall extends in a circumferential direction around a center of the heating unit.

<Remark 9>

The heat treatment apparatus of any one of Remarks 1 to 8, wherein the discharge opening includes a first discharge opening that is opened to the first space and a second discharge opening that is opened to the second space, when the heating unit is viewed from a top, a length of the second discharge opening is smaller than a length of the heating unit in a width direction orthogonal to a direction connecting a center of the heating unit and a center of the second discharge opening, the second space includes a first flow path including a connection port with respect to the first space and a second flow path having a smaller size than the first flow path in the width direction, and at least a part of the second flow path is provided at a position overlapping the heating unit.

<Remark 10>

The heat treatment apparatus of any one of Remarks 1 to 9, wherein a carry-in/out opening for the substrate is provided in a side wall of the chamber, the heat treatment apparatus further includes a shutter member disposed with a gap therebetween with the side wall and configured to switch between a closed state where the carry-in/out opening is covered from a side and an open state where the carry-in/out opening is opened, and in the closed state, the gap between the side wall and the shutter member is greater than a gap formed under the shutter member.

<Remark 11>

The heat treatment apparatus of any one of Remarks 1 to 10, wherein the chamber has a bottom wall provided around the substrate supported by the heating unit and disposed with a gap therebetween with the heating unit, and the bottom wall includes multiple inlet holes, arranged around the substrate supported by the heating unit, connecting the first space to an outside of the chamber.

<Remark 12>

The heat treatment apparatus of Remark 11, wherein the multiple inlet holes are formed in the bottom wall such that a sum of opening areas of the multiple inlet holes in a first region is smaller than that in a second region, when the heating unit is viewed from a top, the first region and the second region are a pair of virtual regions obtained by dividing the first space into two parts with a center of the heating unit as a boundary in a direction connecting the center of the heating unit and a center of the discharge opening, and when the heating unit is viewed from the top, a connection port between the first space and the second space overlaps the first region.

According to the present disclosure, there are provided the heat treatment apparatus and the heat treatment method useful in collecting the sublimates efficiently and reducing the effect on the film thickness distribution.

From the foregoing, it will be appreciated that various exemplary embodiments of the present disclosure have been described herein for purposes of illustration and various changes can be made without departing from the scope and spirit of the present disclosure. Accordingly, various exemplary embodiments described herein are not intended to be limiting, and the true scope and spirit are indicated by the following claims.

We claim:

1. A heat treatment apparatus, comprising:

a heating unit configured to support and heat a substrate on which a film of a processing liquid is formed;

a chamber surrounding the substrate supported by the heating unit;

an exhaust unit configured to discharge a gas from an inner space of the chamber through a discharge opening located near the heating unit;

a partition unit configured to partition the inner space of the chamber into a first space where the substrate on the heating unit is exposed and a second space located above the first space;

a switching unit configured to switch between a second state where the gas is discharged by the exhaust unit through the second space at an early stage of heating the substrate and a first state where the gas is discharged by the exhaust unit through the first space at a late stage of heating the substrate; and a controller configured to control the switching unit to switch from the second state to the first state while the substrate is heated by the heating unit, wherein the discharge opening includes a first discharge opening that is disposed at a side of the first space.

2. The heat treatment apparatus of claim 1, wherein the first discharge opening is opened to the first space, the discharge opening further includes a second discharge opening that is opened to the second space, and the switching unit includes a closing member configured to open a first channel connected to the first discharge opening and close a second channel connected to the second discharge opening in the first state, and configured to close the first channel and open the second channel in the second state.

3. The heat treatment apparatus of claim 1, further comprising:

a flow path control unit including an inner wall provided around the heating unit in the first space and configured to partition the first space into an accommodation space including the heating unit and a control space including the discharge opening, wherein the inner wall includes multiple discharge holes, connecting the accommodation space and the control space, arranged in an extension direction of the inner wall.

4. The heat treatment apparatus of claim 3, wherein the flow path control unit further includes a second inner wall that partitions the control space into a buffer space including the inner wall and a discharge space including the discharge opening, and the second inner wall includes multiple second discharge holes, connecting the buffer space and the discharge space, arranged in an extension direction of the second inner wall.

5. The heat treatment apparatus of claim 3, wherein when the heating unit is viewed from a top, a length of the inner wall is greater than a length of the substrate on the heating unit in a width direction orthogonal to a direction connecting a center of the heating unit and a center of the discharge opening.

6. The heat treatment apparatus of claim 3, wherein when the heating unit is viewed from a top, each of the multiple discharge holes penetrates through the inner wall in a direction connecting a center of the heating unit and a center of the discharge opening.

7. The heat treatment apparatus of claim 3, wherein when the heating unit is viewed from a top, the inner wall extends in a circumferential direction around a center of the heating unit.

8. The heat treatment apparatus of claim 1, wherein the first discharge opening is opened to the first space, the discharge opening further includes a second discharge opening that is opened to the second space, when the heating unit is viewed from a top, a length of the second discharge opening is smaller than a length of the heating unit in a width direction orthogonal to a direction connecting a center of the heating unit and a center of the second discharge opening, the second space includes a first flow path including a connection port with respect to the first space and a second flow path having a smaller size than the first flow path in the width direction, and at least a part of the second flow path is provided at a position overlapping the heating unit.

9. The heat treatment apparatus of claim 1, wherein a carry-in/out opening for the substrate is provided in a side wall of the chamber, the heat treatment apparatus further includes a shutter member disposed with a gap therebetween with the side wall and configured to switch between a closed state where the carry-in/out opening is covered from a side and an open state where the carry-in/out opening is opened, and in the closed state, the gap between the side wall and the shutter member is greater than a gap formed under the shutter member.

10. The heat treatment apparatus of claim 1, wherein the chamber has a bottom wall provided around the substrate supported by the heating unit and disposed with a gap therebetween with the heating unit, and the bottom wall includes multiple inlet holes, arranged around the substrate supported by the heating unit, connecting the first space to an outside of the chamber.

11. The heat treatment apparatus of claim 10, wherein the multiple inlet holes are formed in the bottom wall such that a sum of opening areas of the multiple inlet holes in a first region is smaller than that in a second region, when the heating unit is viewed from a top, the first region and the second region are a pair of virtual regions obtained by dividing the first space into two parts with a center of the heating unit as a boundary in a direction connecting the center of the heating unit and a center of the discharge opening, and when the heating unit is viewed from the top, a connection port between the first space and the second space overlaps the first region.

12. The heat treatment apparatus of claim 1, wherein the switching unit is disposed at a downstream portion of an exhaust path through which the gas is exhausted in one direction.

13. A heat treatment apparatus, comprising:

a heating unit configured to support and heat a substrate on which a film of a processing liquid is formed;

a chamber surrounding the substrate supported by the heating unit;

an exhaust unit configured to discharge a gas from an inner space of the chamber through a discharge opening located near the heating unit;

a partition unit configured to partition the inner space of the chamber into a first space where the substrate on the heating unit is exposed and a second space located above the first space; and a switching unit configured to switch between a first state where the gas is discharged by the exhaust unit through the first space and a second state where the gas is discharged by the exhaust unit through the second space, wherein the discharge opening includes a first discharge opening that is opened to the first space and a second discharge opening that is opened to the second space, and the switching unit includes a closing member configured to open a first channel connected to the first discharge opening and close a second channel connected to the second discharge opening in the first state, and configured to close the first channel and open the second channel in the second state, the closing member is further configured to rotate around a central axis, between a first position corresponding to the first state and a second position corresponding to the second state.

14. A heat treatment method using a heat treatment apparatus equipped with a heating unit configured to support and heat a substrate; a chamber surrounding the substrate supported by the heating unit; an exhaust unit configured to discharge a gas from an inner space of the chamber through a discharge opening located near the heating unit; and a partition unit configured to partition the inner space of the chamber into a first space where the substrate on the heating unit is exposed and a second space located above the first space, the heat treatment method comprising:

heating the substrate onto which a processing liquid is supplied by the heating unit; and switching between a second state where the gas is discharged by the exhaust unit through the second space at an early stage of heating the substrate and a first state where the gas is discharged by the exhaust unit through the first space at a late stage of heating the substrate, wherein the discharge opening includes a first discharge opening that is disposed at a side of the first space.

15. A heat treatment method using a heat treatment apparatus equipped with a heating unit configured to support and heat a substrate; a chamber surrounding the substrate supported by the heating unit; an exhaust unit configured to discharge a gas from an inner space of the chamber through a discharge opening located near the heating unit; and a partition unit configured to partition the inner space of the chamber into a first space where the substrate on the heating unit is exposed and a second space located above the first space, the heat treatment method comprising:

heating the substrate onto which a processing liquid is supplied by the heating unit; and switching between a first state where the gas is discharged by the exhaust unit through the first space and a second state where the gas is discharged by the exhaust unit through the second space by a switching unit, wherein the discharge opening includes a first discharge opening that is opened to the first space and a second discharge opening that is opened to the second space, the switching unit includes a closing member configured to open a first channel connected to the first discharge opening and close a second channel connected to the second discharge opening in the first state, and configured to close the first channel and open the second channel in the second state, and the closing member is further configured to rotate around a central axis, between a first position corresponding to the first state and a second position corresponding to the second state.

* * * * *